US012810905B2

(12) United States Patent
Narasaki

(10) Patent No.: US 12,810,905 B2
(45) Date of Patent: Nov. 24, 2026

(54) SEMICONDUCTOR STORAGE DEVICE AND METHOD OF MANUFACTURING SEMICONDUCTOR STORAGE DEVICE

(71) Applicant: Kioxia Corporation, Tokyo (JP)

(72) Inventor: Ryota Narasaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 159 days.

(21) Appl. No.: 18/970,455

(22) Filed: Dec. 5, 2024

(65) Prior Publication Data

US 2025/0299704 A1 Sep. 25, 2025

(30) Foreign Application Priority Data

Mar. 19, 2024 (JP) ................................ 2024-043398

(51) Int. Cl.
*G11C 5/06* (2006.01)
*H10B 12/00* (2023.01)

(52) U.S. Cl.
CPC ........... *G11C 5/063* (2013.01); *H10B 12/482* (2023.02); *H10B 12/488* (2023.02)

(58) Field of Classification Search
CPC .................................. G11C 5/063; G11C 5/06
USPC ........................................................... 365/63
See application file for complete search history.

(56) References Cited

U.S. PATENT DOCUMENTS

| | | | | |
|---|---|---|---|---|
| 2018/0269210 | A1* | 9/2018 | Tezuka | G11C 11/5628 |
| 2021/0183861 | A1* | 6/2021 | Lee | H10B 12/30 |
| 2022/0130831 | A1 | 4/2022 | Lee et al. | |
| 2022/0271040 | A1* | 8/2022 | Kim | H10B 12/05 |
| 2022/0320103 | A1 | 10/2022 | Lee et al. | |

* cited by examiner

*Primary Examiner* — Muna A Techane
(74) *Attorney, Agent, or Firm* — Foley & Lardner LLP

(57) ABSTRACT

A semiconductor storage device according to one embodiment includes a multi-layered body and a first wiring. The multi-layered body includes a plurality of first layers and a plurality of second layers. The first wiring extends in a first direction within the multi-layered body. Each of the plurality of first layers includes a second wiring, a capacitor electrode, a semiconductor layer, and a first protruding portion. The second wiring extends in a second direction intersecting with the first direction. At least a part of the semiconductor layer is between the second wiring and the capacitor electrode. The first protruding portion protrudes from the second wiring in a third direction intersecting with the first direction and the second direction and covers at least a part of the semiconductor layer from one side in the first direction.

10 Claims, 18 Drawing Sheets

SEMICONDUCTOR STORAGE DEVICE AND METHOD OF MANUFACTURING SEMICONDUCTOR STORAGE DEVICE

CROSS-REFERENCE TO RELATED APPLICATION

This application is based upon and claims the benefit of priority from Japanese Patent Application No. 2024-043398, filed on Mar. 19, 2024, the entire contents of which are incorporated herein by reference.

FIELD

Embodiments of the present invention relate to a semiconductor storage device and a method of manufacturing a semiconductor storage device.

BACKGROUND ART

A semiconductor storage device having a plurality of three-dimensionally disposed capacitors has been proposed.

DETAILED DESCRIPTION

Figure 1:
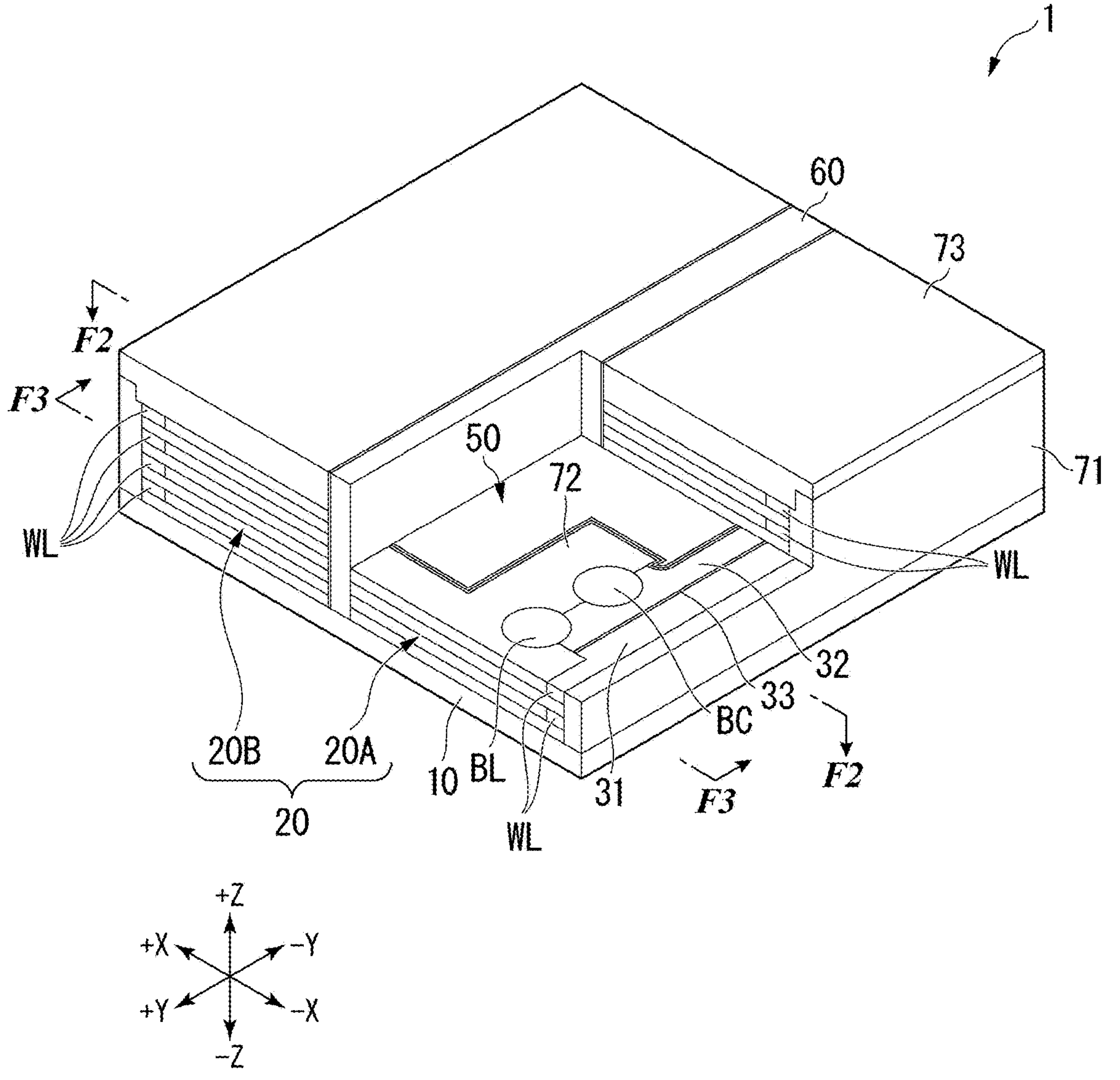
FIG. 1 is a perspective view showing a part of a semiconductor storage device according to a first embodiment.

A semiconductor storage device according to one embodiment includes a multi-layered body and a first wiring. The multi-layered body includes a plurality of first layers and a plurality of second layers. The plurality of first layers and the plurality of second layers are alternately stacked one by one in a first direction. The first wiring extends in the first direction within the multi-layered body. Each of the plurality of first layers includes a second wiring, a capacitor electrode, a semiconductor layer, a first protruding portion, and a second protruding portion. The second wiring extends in a second direction intersecting with the first direction. At least a part of the semiconductor layer is between the second wiring and the capacitor electrode. The first protruding portion protrudes from the second wiring in a third direction intersecting with the first direction and the second direction. The first protruding portion covers at least a part of the semiconductor layer from one side in the first direction. The second protruding portion protrudes from the second wiring in a third direction. The second protruding portion covers at least a part of the semiconductor layer from the other side in the first direction.

Hereinafter, a semiconductor storage device and a method of manufacturing a semiconductor storage device according to embodiments will be described with reference to the drawings. In the following description, constituent elements having the same or similar functions are denoted by the same reference signs. In addition, overlapping descriptions of those constituent elements may be omitted. In addition, in the following description, reference signs with a distinguishing number or letter at the end thereof may have the number or letter omitted in a case in which they do not need to be distinguished from each other.

In the present application, the terms are defined as follows. The terms "parallel", "orthogonal", and "same" may also include the cases of "substantially parallel", "substantially orthogonal", and "substantially the same", respectively. The term "connection" is not limited to mechanical connection, and may include electrical connection. In other words, the term "connection" is not limited to a case in which a plurality of elements are directly connected to each other, and may include a case in which a plurality of elements are connected to each other with another element interposed therebetween. The term "overlapping" is not limited to a case in which a plurality of elements overlap each other by coming into contact with each other, and may also include a case in which a plurality of elements are spaced from each other (a case in which the projected images of the plurality of elements overlap each other when viewed in a certain direction). The term "adjacent" is not limited to a case in which a plurality of elements are adjacent to each other by coming into contact with each other, and may also include a case in which a plurality of elements are adjacent to each other with another element interposed therebetween.

A +X direction, a −X direction, a +Y direction, a −Y direction, a +Z direction, and a −Z direction are defined as follows. The +X direction is a direction from the word line WL of a first multi-layered body 20A toward a capacitor 50

(refer to FIG. 1), which will be described below. The −X direction is a direction opposite to the +X direction. In a case in which there is no need to distinguish between the +X direction and the −X direction, an X direction is simply referred to. The +Y direction is a direction intersecting with (for example, is orthogonal to) the X direction. The +Y direction is a direction in which the word line WL extends (refer to FIG. 1). The −Y direction is a direction opposite to the +Y direction. In a case in which there is no need to distinguish between the +Y direction and the −Y direction, a Y direction is simply referred to. The +Z direction is a direction intersecting with (for example, is orthogonal to) the X direction and the Y direction. The +Z direction is a direction from a semiconductor substrate 10 toward a multi-layered body 20 (refer to FIG. 1), which will be described below. The −Z direction is a direction opposite to the +Z direction. In a case in which there is no need to distinguish between the +Z direction and the −Z direction, a Z direction is simply referred to. The Z direction is an example of a "first direction". The Y direction is an example of a "second direction". The X direction is an example of a "third direction". In the following description, a side in the +Z direction may be referred to as an "upper side", and a side in the −Z direction may be referred to as a "lower side". However, these expressions are given for the convenience of explanation and do not define a direction of gravity.

First Embodiment

1. Configuration of Semiconductor Storage Device

FIG. 1 is a perspective view showing a part of a semiconductor storage device 1. In FIG. 1, in order to make the internal structure of the semiconductor storage device 1 easier to understand, a part of an upper layer side is removed. In reality, the removed portion has the same structure as the other portions. In addition, the semiconductor storage device 1 has a plurality of unit structures, each of which is the structure shown in FIG. 1, in the X direction and the Y direction.

The semiconductor storage device 1 is, for example, a dynamic random access memory (DRAM) having a three-dimensional structure. The semiconductor storage device 1 includes a plurality of memory cells disposed three-dimensionally. The semiconductor storage device 1 includes, for example, a semiconductor substrate 10, a multi-layered body 20, a plurality of bit lines BL, a plurality of body contacts BC, a common electrode 60, an insulating portion 71, an insulating portion 72, and an insulating portion 73. In FIG. 1, only one of the plurality of bit lines BL is shown, and only one of the plurality of body contacts BC is shown.

1.1 Semiconductor Substrate

The semiconductor substrate 10 is, for example, a substrate that serves as a base of the semiconductor storage device 1. At least a part of the semiconductor substrate 10 is in the form of a plate extending in the X direction and the Y direction. The semiconductor substrate 10 is formed of a semiconductor material such as silicon.

1.2 Multi-Layered Body

Next, the multi-layered body 20 will be described. The multi-layered body 20 includes a first multi-layered body 20A and a second multi-layered body 20B. The first multi-layered body 20A is disposed on a side in the −X direction with respect to the common electrode 60. The second multi-layered body 20B is disposed on a side in the +X direction with respect to the common electrode 60. The first multi-layered body 20A and the second multi-layered body 20B have a symmetrical configuration with respect to the common electrode 60. For this reason, in the following, the configuration of the first multi-layered body 20A will be described as a representative example. The configuration of the second multi-layered body 20B can be achieved by reversing the "+X direction" and the "−X direction" in the description of the first multi-layered body 20A.

Figure 2:
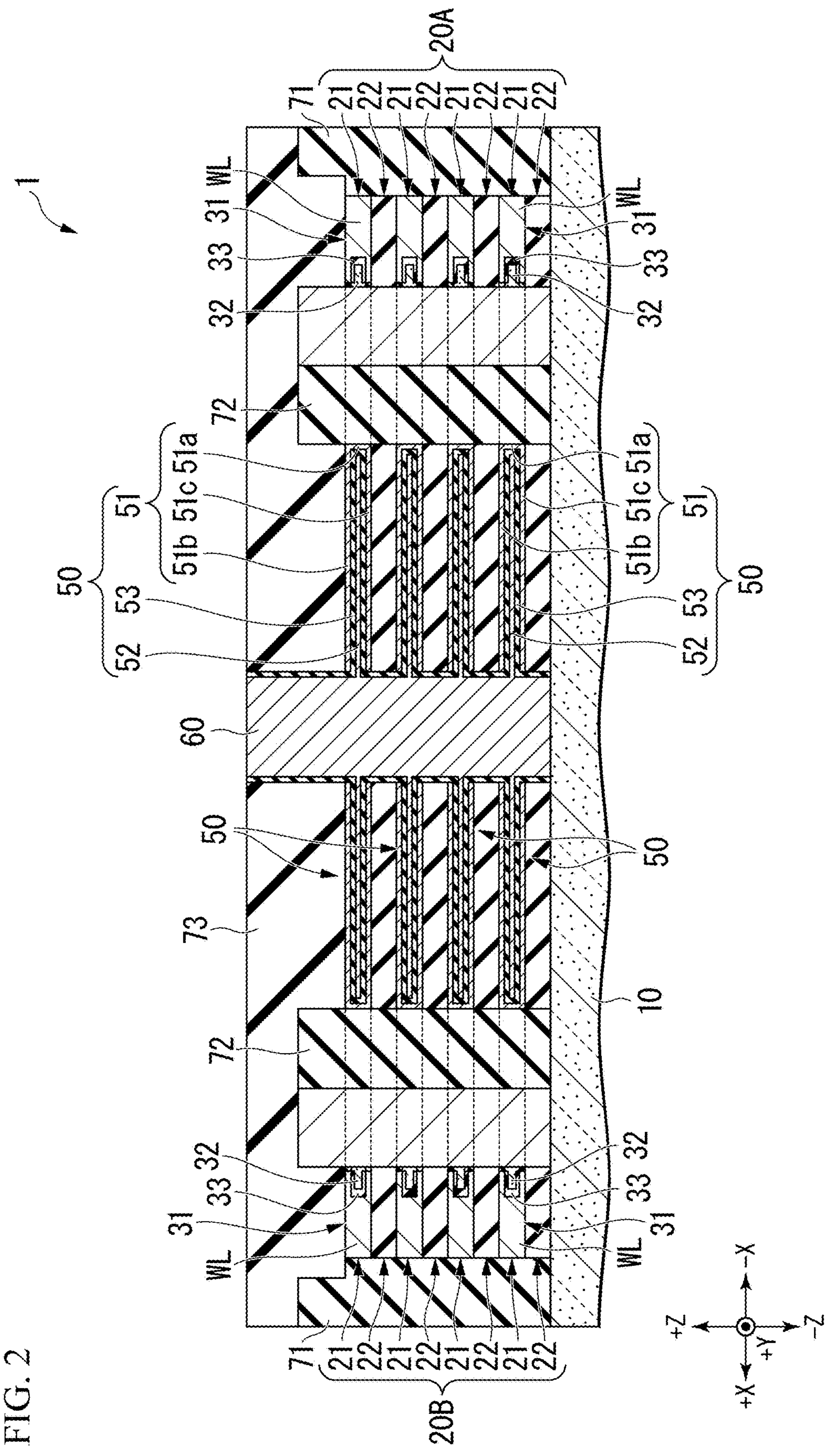
FIG. 2 is a cross-sectional view taken along line F2-F2 of the semiconductor storage device shown in FIG. 1.

FIG. 2 is a cross-sectional view taken along line F2-F2 of the semiconductor storage device 1 shown in FIG. 1. The first multi-layered body 20A includes, for example, a plurality of first layers 21 and a plurality of second layers 22. The plurality of first layers 21 and the plurality of second layers 22 are alternately stacked one by one in the Z direction.

<1.2.1 First Layer>

The first layer 21 is a layer extending in the X direction and the Y direction. The first layer 21 includes, for example, a conductive layer 31, a semiconductor layer 32, a gate insulating film 33, and a capacitor 50. In the present embodiment, the conductive layer 31, the semiconductor layer 32, the gate insulating film 33, and the capacitor 50 are located in the same layer within the multi-layered body 20. The conductive layer 31, the semiconductor layer 32, the gate insulating film 33, and the capacitor 50 are disposed, for example, side by side in the X direction.

(Conductive Layer)

The conductive layer 31 is disposed between the insulating portion 71 and the semiconductor layer 32, which will be described below. The conductive layer 31 extends in the Y direction. The conductive layer 31 includes a conductive material such as tungsten and has electrical conductivity. The conductive layer 31 includes, for example, a word line WL and a pair of protruding portions 42 (refer to FIG. 4). The pair of protruding portions 42 will be described below.

Figure 3:
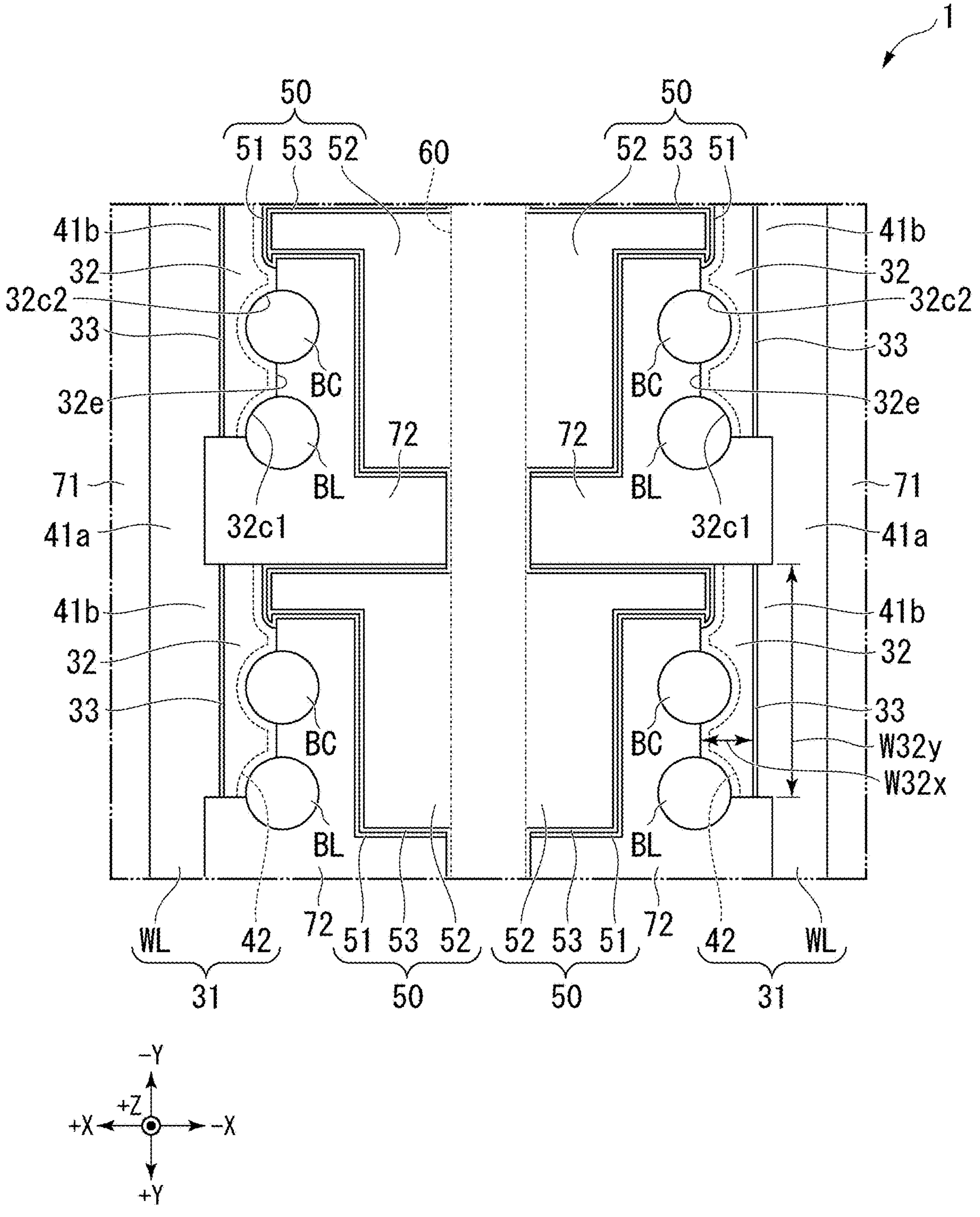
FIG. 3 is a cross-sectional view taken along line F3-F3 of the semiconductor storage device shown in FIG. 1.

FIG. 3 is a cross-sectional view taken along line F3-F3 of the semiconductor storage device 1 shown in FIG. 1. The word line WL is disposed between the insulating portion 71 and the semiconductor layer 32. The word line WL extends linearly in the Y direction. The word line WL extends, for example, in the Y direction over the sides of a plurality of capacitors 50. A current flows in the Y direction through the word line WL. The word line WL is an example of a "second wiring".

(Semiconductor Layer)

At least a part (for example, the entirety) of the semiconductor layer 32 is disposed between the word line WL and the capacitor 50. In the present embodiment, at least a part (for example, the entirety) of the semiconductor layer 32 is disposed between the word line WL and the capacitor 50 in the X direction. The semiconductor layer 32 is adjacent to the word line WL in the X direction with the gate insulating film 33 interposed therebetween. The semiconductor layer 32 is adjacent to the capacitor 50 in the X direction.

The semiconductor layer 32 extends in the Y direction along the word line WL, for example. In the present embodiment, a width W32*y* of the semiconductor layer 32 in the Y direction is larger than a width (for example, the maximum width) W32*x* of the semiconductor layer 32 in the X direction. In the Y direction, the insulating portion 72 is provided between a plurality of semiconductor layers 32. The plurality of semiconductor layers 32 are electrically insulated from each other by the insulating portion 72. The semiconductor layer 32 includes a semiconductor material such as silicon (for example, polysilicon). The semiconductor layer 32 may be doped with an impurity. In a case in which a voltage is applied to the word line WL, the semiconductor layer 32 can form a channel (a current path P, see FIG. 6) to electrically connect the bit line BL and the capacitor 50 to each other.

(Gate Insulating Film)

The gate insulating film 33 is disposed between the word line WL and the semiconductor layer 32. The gate insulating film 33 extends in the Y direction along a boundary between the word line WL and the semiconductor layer 32. The gate insulating film 33 is formed of, for example, a film including silicon and oxygen. In the present embodiment, one MOS transistor for a DRAM is formed by the conductive layer 31, the semiconductor layer 32, and the gate insulating film 33 which are described above.

(Capacitor)

The capacitor 50 is disposed between the semiconductor layer 32 and the common electrode 60. The capacitor 50 is a charge storage portion for a DRAM. The capacitor 50 includes, for example, a first capacitor electrode 51, a second capacitor electrode 52, and a capacitor dielectric layer 53.

A part of the first capacitor electrode 51 is adjacent to the semiconductor layer 32 in the X direction and is connected to the semiconductor layer 32. For example, a part of the first capacitor electrode 51 is in contact with the semiconductor layer 32 in the X direction. The first capacitor electrode 51 is formed of, for example, a metal material such as tungsten.

In the present embodiment, the first capacitor electrode 51 includes a first portion 51*a*, a second portion 51*b*, and a third portion 51*c*. The first portion 51*a* is adjacent to the semiconductor layer 32 in the X direction. The first portion 51*a* is in contact with the semiconductor layer 32 (refer to FIG. 7). The first portion 51*a* extends in the Z direction. The first portion 51*a* is a film extending in the Z direction and the Y direction. The second portion 51*b* extends in the X direction from an end of the first portion 51*a* on a side in the +Z direction toward the common electrode 60. The second portion 51*b* is a film extending in the X direction and the Y direction. The second portion 51*b* is in contact with the second layer 22 located on the side in the +Z direction of the capacitor 50. The third portion 51*c* extends in the X direction from an end of the first portion 51*a* on a side in the −Z direction toward the common electrode 60. The third portion 51*c* is a film extending in the X direction and the Y direction. The third portion 51*c* is in contact with the second layer 22 located on the side in the −Z direction of the capacitor 50.

The second capacitor electrode 52 is connected to the common electrode 60 in the X direction. The second capacitor electrode 52 is formed of, for example, a metal material such as tungsten. At least a part of the second capacitor electrode 52 faces the first capacitor electrode 51 in the Z direction. In the present embodiment, the second capacitor electrode 52 is a film extending in the X direction and the Y direction. The second capacitor electrode 52 is disposed between the second portion 51*b* and the third portion 51*c* of the first capacitor electrode 51 in the Z direction. At least a part of the second capacitor electrode 52 faces the second portion 51*b* and the third portion 51*c* of the first capacitor electrode 51 in the Z direction.

The capacitor dielectric layer 53 is provided between the first capacitor electrode 51 and the second capacitor electrode 52. In the present embodiment, the capacitor dielectric layer 53 is provided between the first portion 51*a* of the first capacitor electrode 51 and the second capacitor electrode 52. The capacitor dielectric layer 53 is provided between the second portion 51*b* of the first capacitor electrode 51 and the second capacitor electrode 52. The capacitor dielectric layer 53 is provided between the third portion 51*c* of the first capacitor electrode 51 and the second capacitor electrode 52. The capacitor dielectric layer 53 is formed of a dielectric material such as hafnium oxide (HfOx).

<1.2.2 Second Layer>

The second layer 22 is an insulating layer extending in the X direction and the Y direction. The second layer 22 is formed of, for example, a film including silicon and oxygen. The second layer 22 is provided between two first layers 21 adjacent to each other in the Z direction. The second layer 22 is an insulating layer (an interlayer insulating film) that insulates the two first layers 21 from each other. In the present embodiment, the second layer 22 overlaps the conductive layer 31, the semiconductor layer 32, the gate insulating film 33, and the capacitor 50 when viewed in the Z direction.

1.3 Bit Line

The bit line BL extends in the multi-layered body 20 in the Z direction. In the present embodiment, the bit line BL is located on a side opposite to the word line WL with respect to the semiconductor layer 32 in the X direction. The bit line BL is adjacent to the semiconductor layer 32 in the X direction. The bit line BL is connected to the semiconductor layer 32. For example, a part of the bit line BL is in contact with the semiconductor layer 32 in the X direction. The bit line BL includes a conductive material such as tungsten and has electrical conductivity. As a result, it is possible to optionally select a capacitor 50 from a plurality of capacitors 50 disposed three-dimensionally by combining the word line WL and the bit line BL. The bit line BL is an example of a "first wiring".

In the present embodiment, the bit line BL is formed in a cylindrical shape. The bit line BL has a circular outer shape when viewed in the Z direction. An edge 32*e* of the semiconductor layer 32 includes an arcuate portion 32*c*1 that is formed in an arcuate shape along the outer shape of the bit line BL.

1.4 Body Contact

The body contact BC extends in the Z direction within the multi-layered body 20. The body contact BC extends parallel to the bit line BL. In the present embodiment, the body contact BC is disposed at a position at which the body contact BC overlaps at least a part of the bit line BL when viewed in the Y direction. The body contact BC is adjacent to the semiconductor layer 32 at least in the X direction. The body contact BC is connected to the semiconductor layer 32. For example, a part of the body contact BC is in contact with the semiconductor layer 32 in the X direction. The body contact BC includes a conductive material such as tungsten and has electrical conductivity. The body contact BC is a contact that suppresses a floating body effect. A predetermined potential is applied to the body contact BC via a wiring (not shown). The body contact BC prevents the semiconductor layer 32 from being in an electrically floating state. The body contact BC prevents holes from accumulating. The body contact BC is an example of a "contact".

In the present embodiment, the body contact BC is formed in a cylindrical shape. The body contact BC has a circular outer shape when viewed in the Z direction. An edge 32*e* of the semiconductor layer 32 includes an arcuate portion 32*c*2 that is formed in an arcuate shape along the outer shape of the body contact BC.

1.5 Common Electrode

The common electrode 60 is provided between the first multi-layered body 20A and the second multi-layered body 20B. The common electrode 60 extends in the Z direction within the multi-layered body 20. The common electrode 60 extends in the Y direction between the first multi-layered body 20A and the second multi-layered body 20B. The common electrode 60 is in the form of a plate extending in the Y direction and the Z direction. The common electrode 60 is connected to the second capacitor electrode 52 of the capacitor 50 in the X direction.

1.6 Insulating Portion

The semiconductor storage device 1 has the insulating portion 71, the insulating portion 72, and the insulating portion 73 (refer to FIG. 2). The insulating portion 71 is provided on a side opposite to the common electrode 60 with respect to the conductive layer 31. The insulating portion 71 extends in the Z direction to pass through the multi-layered body 20. The insulating portion 71 reaches the semiconductor substrate 10. In addition, the insulating portion 71 extends in the Y direction. The insulating portion 72 is located on a side opposite to the conductive layer 31 with respect to the semiconductor layer 32, the bit line BL, and the body contact BC. The insulating portion 72 is provided between the semiconductor layer 32, the bit line BL, the body contact BC, and the common electrode 60. The insulating portion 72 extends in the Z direction to pass through the multi-layered body 20. The insulating portion 72 reaches the semiconductor substrate 10. The insulating portion 73 is provided on a side opposite to the semiconductor substrate 10 with respect to the multi-layered body 20.

2. Configuration of Conductive Layer

Next, the configuration of the conductive layer 31 will be described.

Figure 4:
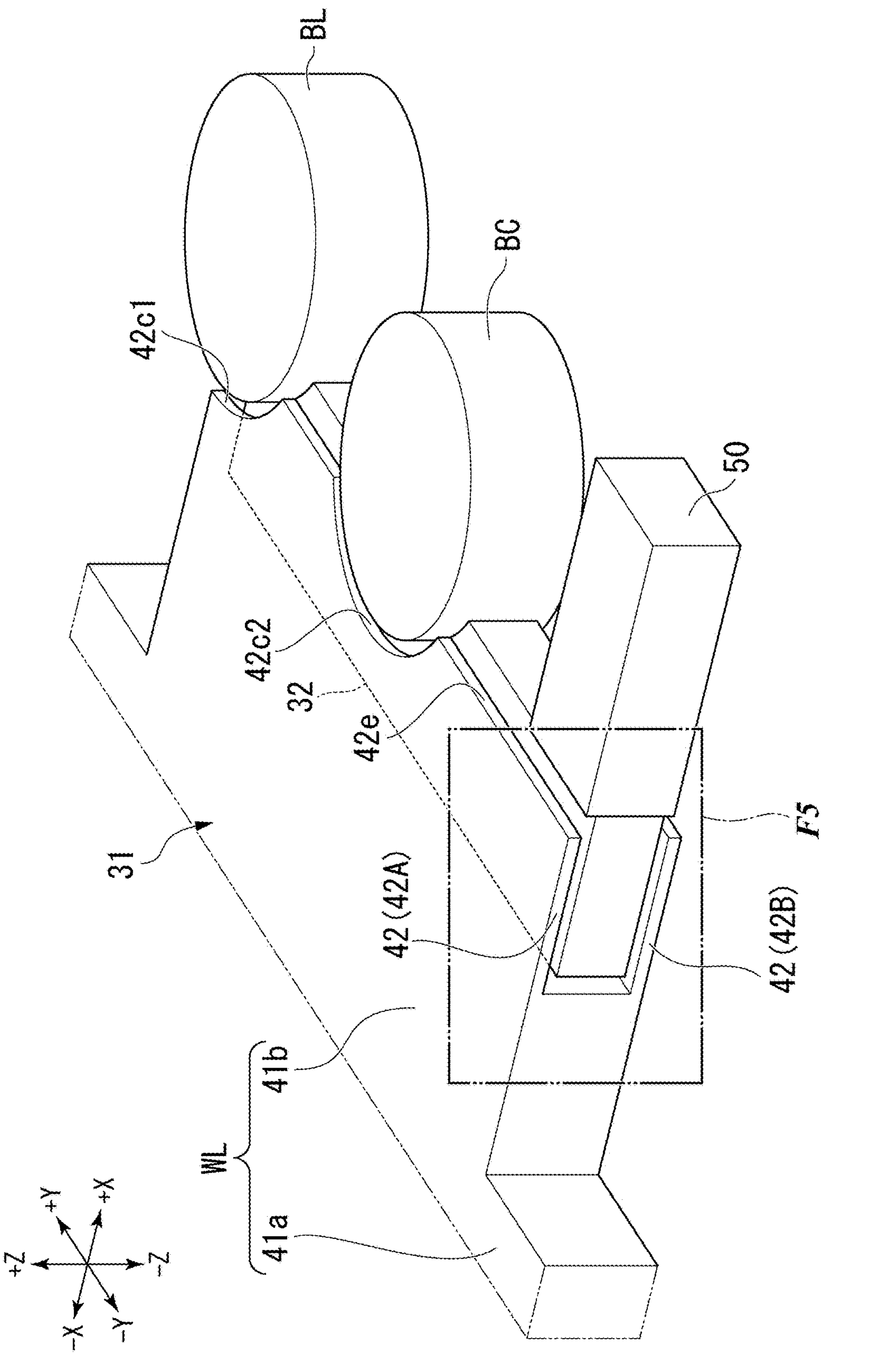
FIG. 4 is a perspective view for explaining a conductive layer of the first embodiment.
Figure 5:
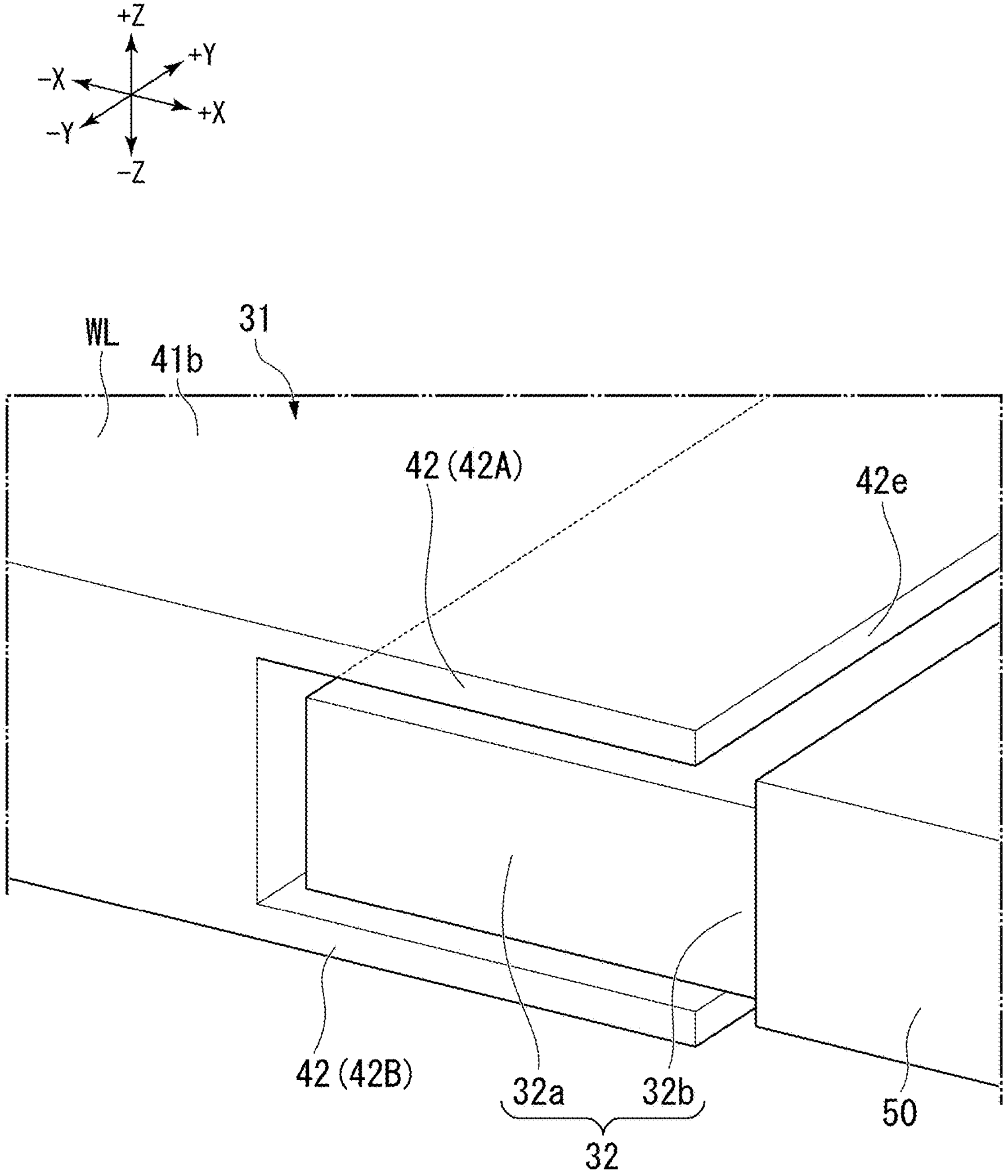
FIG. 5 is an enlarged perspective view showing a region surrounded by line F5 in a configuration shown in FIG. 4.

FIG. 4 is a perspective view for explaining the conductive layer 31. FIG. 5 is an enlarged perspective view showing a region surrounded by line F5 in a configuration shown in FIG. 4. For convenience of explanation, the gate insulating film 33 is omitted in FIGS. 4 and 5. In addition, a perspective direction in FIGS. 4 and 5 is different from that in FIG. 1 for convenience of explanation.

In the present embodiment, the conductive layer 31 includes, for example, the word line WL and the pair of protruding portions 42 (a first protruding portion 42A and a second protruding portion 42B).

2.1 Word Line

The word line WL includes a first portion 41*a* and a second portion 41*b*. The first portion 41*a* extends, for example, in the Y direction over the sides of the plurality of capacitors 50 (refer to FIG. 3). The second portion 41*b* is provided in a region corresponding to the semiconductor layer 32 (refer to FIG. 3). The insulating portion 72 is provided between a plurality of second portions 41*b* aligned in the Y direction. The plurality of second portion 41*b* are electrically insulated from each other by the insulating portion 72. The second portion 41*b* extends from the first portion 41*a* toward the semiconductor layer 32. The second portion 41*b* is in the form of a plate extending in the X direction and the Y direction.

Figure 6:
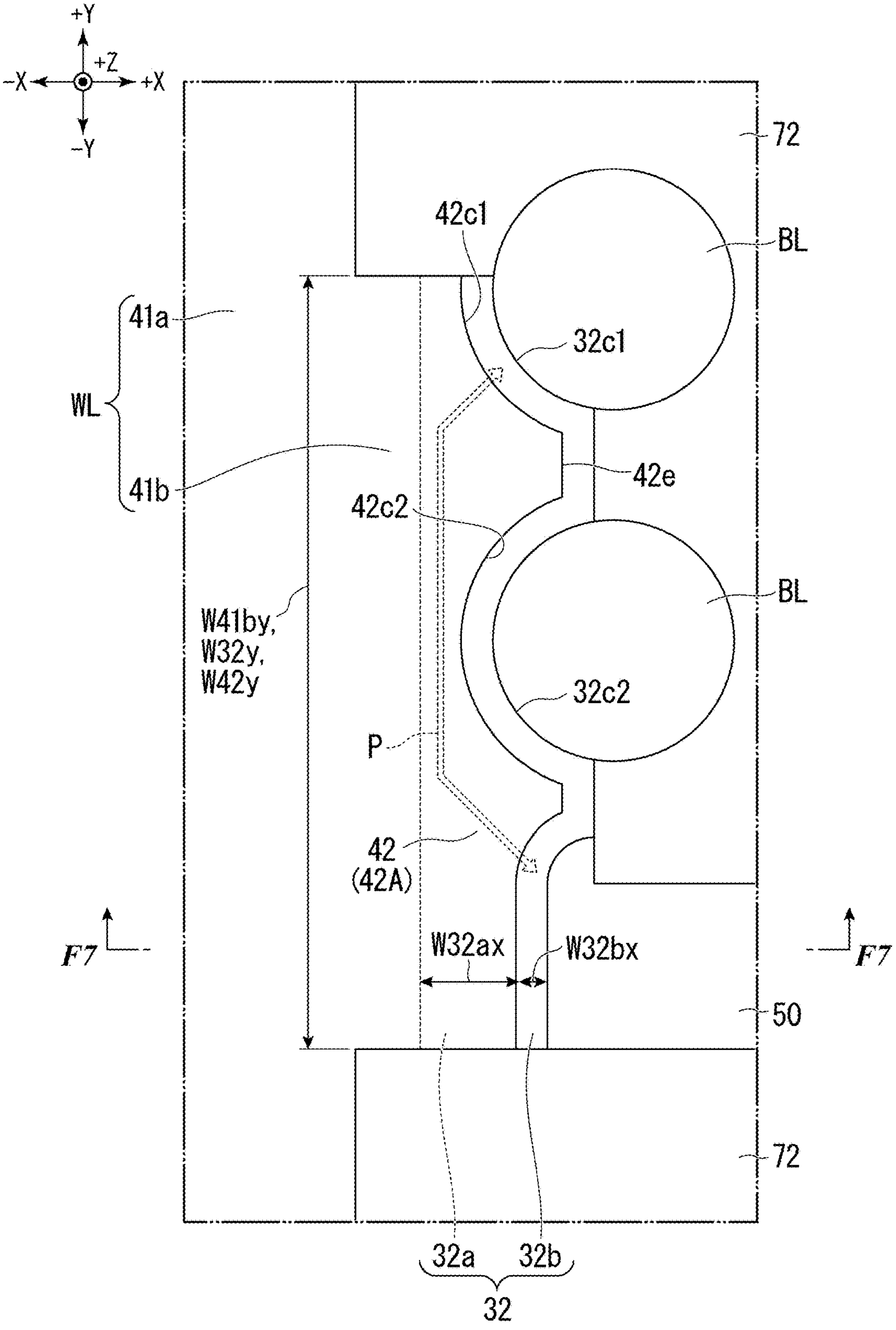
FIG. 6 is a plan view for explaining the conductive layer of the first embodiment.

A width W41*by* of the second portion 41*b* in the Y direction is greater than or equal to a width W32*y* of the semiconductor layer 32 in the Y direction (refer to FIG. 6). In the present embodiment, the width W41*by* of the second portion 41*b* in the Y direction is equal to the width W32*y* of the semiconductor layer 32 in the Y direction. The width W41*by* of the second portion 41*b* in the Y direction may be smaller than the width W32*y* of the semiconductor layer 32 in the Y direction. The word line WL may be formed by the first portion 41*a* without having the second portion 41*b*. The word line WL is a gate electrode facing the semiconductor layer 32 in the X direction.

2.2 First Protruding Portion

The first protruding portion 42A protrudes from a part of the word line WL in the X direction. In the present embodiment, the first protruding portion 42A protrudes in the X direction from a part of the second portion 41*b* of the word line WL. For example, the first protruding portion 42A protrudes in the X direction from a part of the word line WL which includes an end on the side in the +Z direction. The first protruding portion 42A covers at least a part of the semiconductor layer 32 from one side in the Z direction (the side in the +Z direction). The first protruding portion 42A is one gate electrode facing the semiconductor layer 32 in the Z direction.

2.3 Second Protruding Portion

The second protruding portion 42B protrudes from the word line WL in the X direction. In the present embodiment, the second protruding portion 42B protrudes in the X direction from a part of the second portion 41*b* of the word line WL. For example, the second protruding portion 42B protrudes in the X direction from a part of the word line WL which includes an end on the side in the −Z direction. The second protruding portion 42B covers at least a part of the semiconductor layer 32 from the other side in the Z direction (the side in the −Z direction). The second protruding portion 42B is one gate electrode facing the semiconductor layer 32 in the Z direction.

FIG. 6 is a plan view for explaining the conductive layer 31. Here, in the present embodiment, the shape of the first protruding portion 42A and the shape of the second protruding portion 42B are the same when viewed in the Z direction. For this reason, in the following description, the first protruding portion 42A and the second protruding portion 42B will be collectively referred to as a "protruding portion 42".

The protruding portion 42 has an edge 42*e* in the X direction. The edge 42*e* is spaced from the bit line BL, the body contact BC, and the capacitor 50. The edge 42*e* includes a first arcuate portion 42*c*1 and a second arcuate portion 42*c*2. The first arcuate portion 42*c*1 is formed in an arcuate shape that follows the outer shape of the bit line BL. The first arcuate portion 42*c*1 has an arcuate shape concentric with the outer shape of the bit line BL. The second arcuate portion 42*c*2 is formed in an arcuate shape that follows the outer shape of the body contact BC. The second arcuate portion 42*c*2 has an arcuate shape concentric with the outer shape of the body contact BC.

The protruding portion 42 covers more than half of the semiconductor layer 32 when viewed in the Z direction. For example, a width W42*y* of the protruding portion 42 in the Y direction is greater than or equal to the width W32*y* of the semiconductor layer 32 in the Y direction. In the present embodiment, the width W42*y* of the protruding portion 42 in the Y direction is equal to the width W32*y* of the semiconductor layer 32 in the Y direction. The width W42*y* of the protruding portion 42 in the Y direction may be smaller than the width W32*y* of the semiconductor layer 32 in the Y direction.

The semiconductor layer 32 includes a first portion 32*a* that overlaps the protruding portion 42 and a second portion 32*b* that does not overlap the protruding portion 42 when viewed from the Z direction. In a region of at least a part of the semiconductor layer 32, a width W32*ax* of the first portion 32*a* in the X direction is larger than a width W32*bx* of the second portion 32*b* in the X direction.

Figure 7:
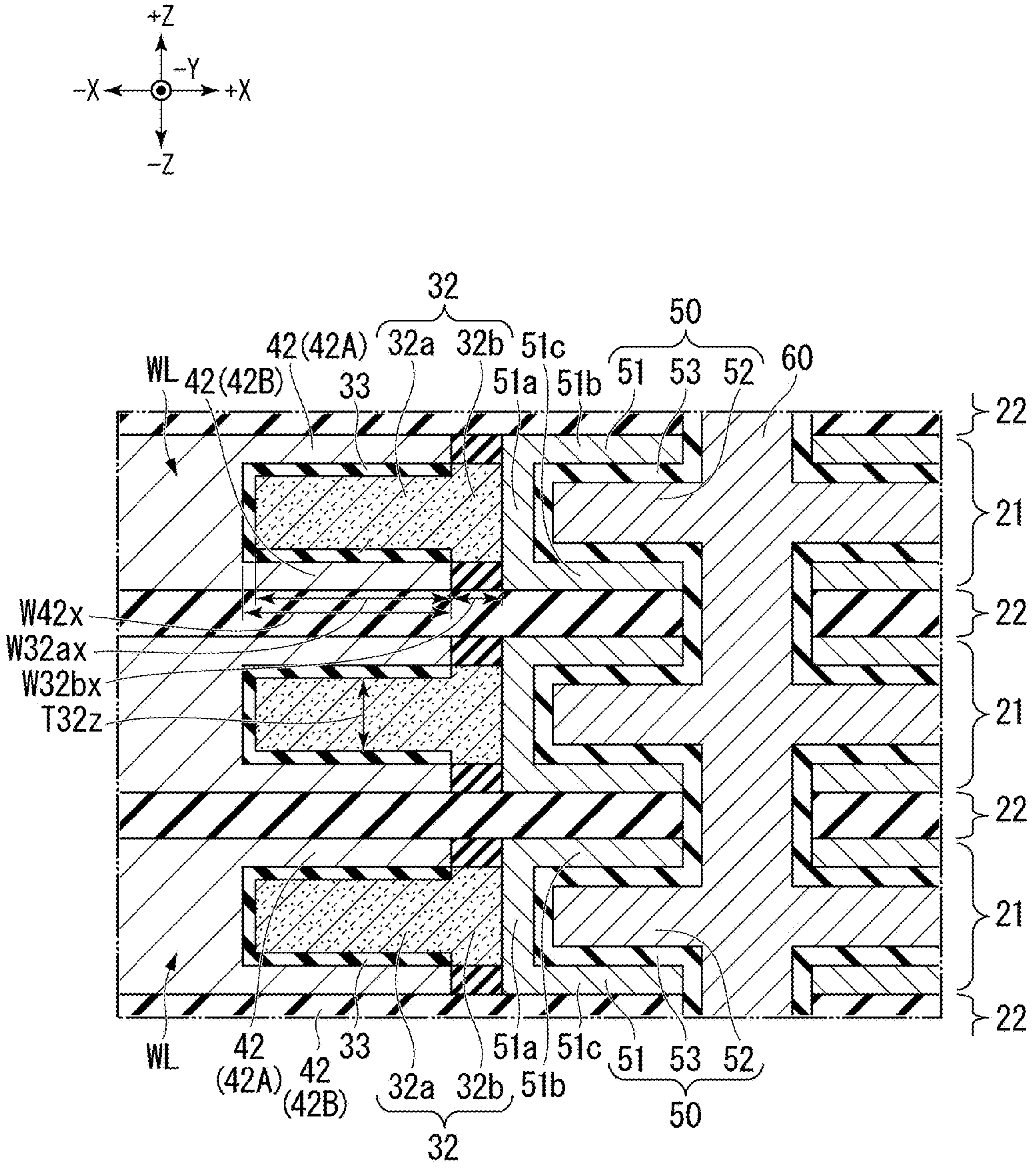
FIG. 7 is a cross-sectional view taken along line F7-F7 in a configuration shown in FIG. 6.

FIG. 7 is a cross-sectional view taken along line F7-F7 in a configuration shown in FIG. 6. In the present embodiment, the width W3*ax* of the first portion 32*a* in the X direction is greater than, for example, a thickness (for example, the minimum thickness) T32*z* of the semiconductor layer 32 in the Z direction. The width W32*bx* of the second portion 32*b* in the X direction is smaller than, for example, the thickness (for example, the minimum thickness) T32*z* of the semiconductor layer 32 in the Z direction. In the present embodiment, a width W42*x* of the protruding portion 42 in the X direction is greater than, for example, the thickness (for example, the minimum thickness) T32*z* of the semiconductor layer 32 in the Z direction.

3. Manufacturing Method

3.1 First Example of Manufacturing Method

Next, a first example of a method of manufacturing the semiconductor storage device 1 will be described.

FIGS. 8 to 11 are cross-sectional views showing the first example of the method of manufacturing the semiconductor storage device 1. First, a multi-layered body 120 is formed on the semiconductor substrate 10 (refer to FIG. 8(*a*)). The multi-layered body 120 includes a plurality of first layers 121 and a plurality of second layers 122. The plurality of first layers 121 and the plurality of second layers 122 are alternately stacked one by one in the Z direction. The first layer 121 is formed of a semiconductor material including silicon (for example, polysilicon). The first layer 121 may be doped with an impurity. The first layer 121 is a layer in which the semiconductor layer 32, which will be described below, is formed. The second layer 122 is formed of, for example, silicon germanium (SiGe). The second layer 122 is a sacrificial layer that will be replaced by another layer in a later step.

Figure 8:
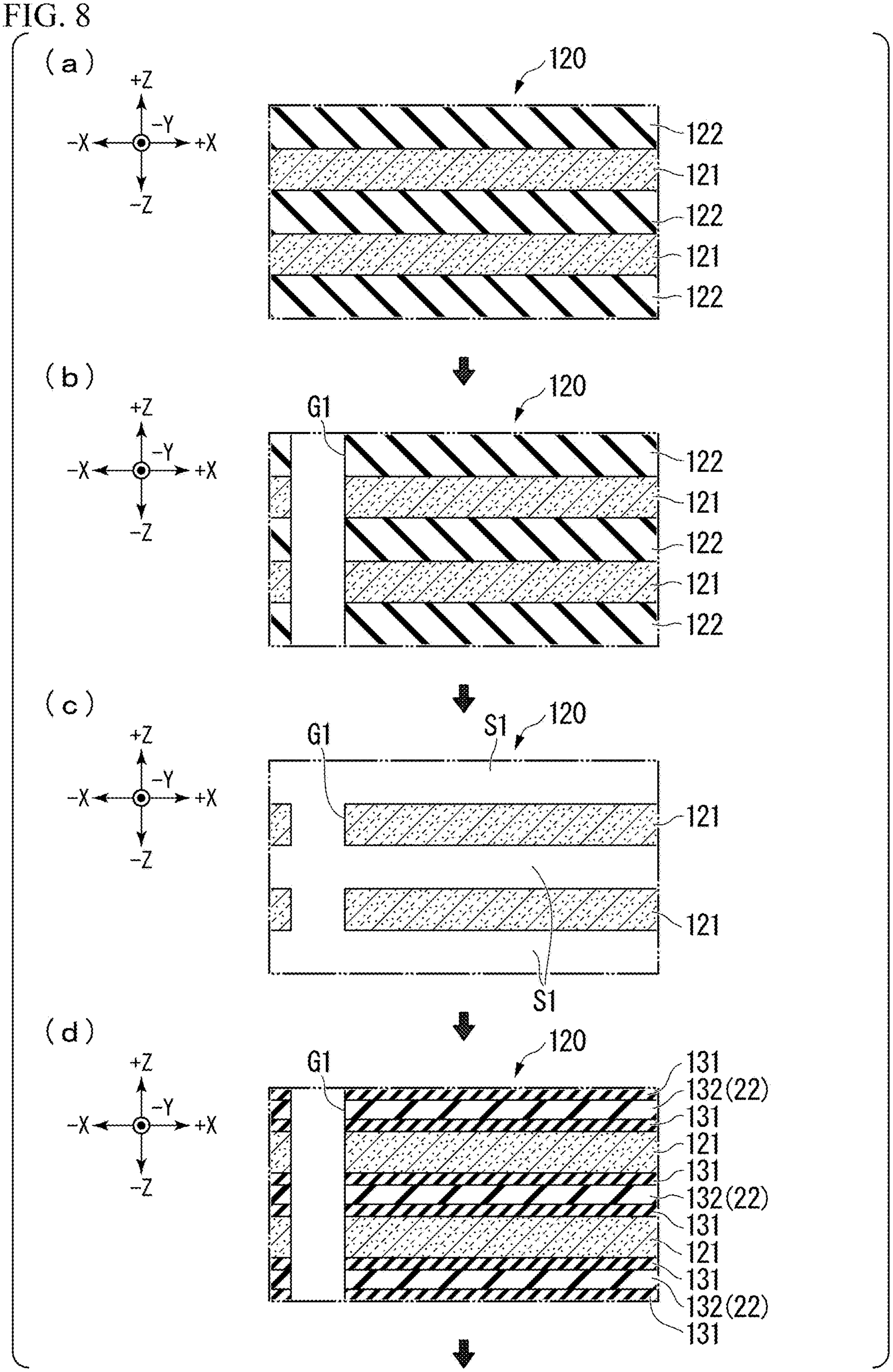
FIG. 8 is a cross-sectional view showing a first example of a method of manufacturing the semiconductor storage device according to the first embodiment.

Next, a groove G1 is formed in the multi-layered body 120 (refer to (b) in FIG. 8). The groove G1 passes through the multi-layered body 120 in the Z direction and reaches the semiconductor substrate 10. Next, at least a part (for example, the entirety) of each of the plurality of second layers 122 is removed by etching through the groove G1. As a result, a first space S1 is formed in the multi-layered body 120 in place of the second layer 122 (refer to (c) in FIG. 8).

Next, a first insulating material is supplied to the first space S1 through the groove G1, and a first insulating layer 131 is formed on the first layer 121. The first insulating layer 131 is formed of, for example, silicon nitride (SiN). Next, a second insulating material is supplied between a plurality of first insulating layers 131 through the grooves G1, and a second insulating layer 132 is formed between the plurality of first insulating layers 131 (refer to (d) in FIG. 8). The second insulating layer 132 is formed of, for example, silicon oxide (SiO). The second insulating layer 132 is an insulating layer that becomes the second layer 22.

Figure 9:
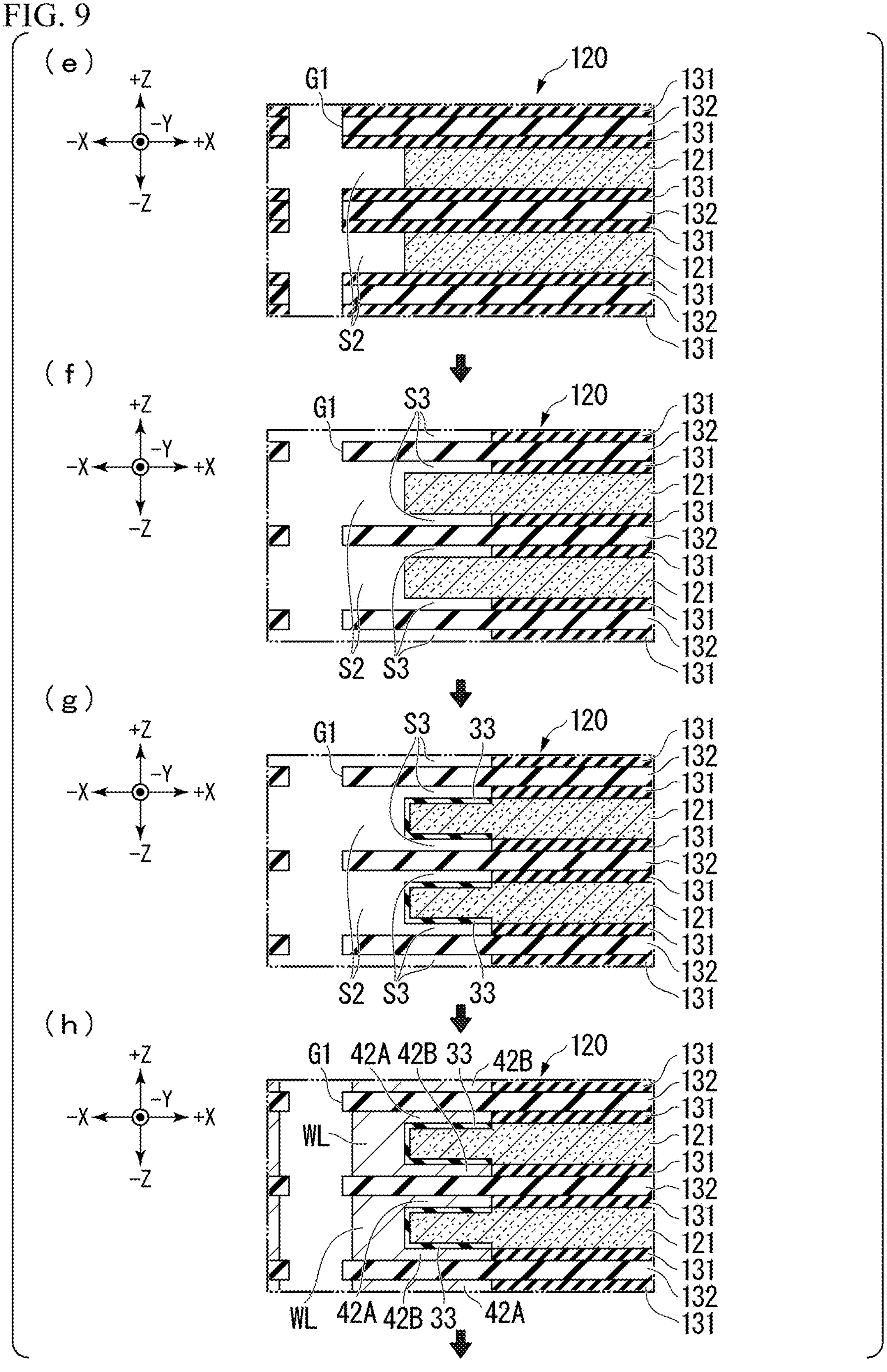
FIG. 9 is a cross-sectional view showing the first example of the method of manufacturing the semiconductor storage device according to the first embodiment.

Next, a part of the first layer 121 is removed by etching through the groove G1 (refer to (e) in FIG. 9). As a result, a second space S2 is formed in the multi-layered body 120 in place of a part of the first layer 121. The second space S2 is a space extending in the Y direction.

Next, a part of the first insulating layer 131 is removed by etching through the groove G1 (refer to (f) in FIG. 9). As a result, a third space S3 is formed in the multi-layered body 120 in place of a part of the first insulating layer 131. The third space S3 protrudes in a direction away from the groove G1 with respect to the second space S2 (the X direction).

Next, an oxidizing agent is supplied to the space S2 and the space S3 to oxidize the surface of the first layer 121 exposed in the space S2 and the space S3. As a result, the gate insulating film 33 is formed on the surface of the first layer 121 (refer to (g) in FIG. 9). In the present application, the phrase "forming the gate insulating film on the surface of the first layer" may include a case in which the surface of the first layer is oxidized such that a part of the first layer becomes the gate insulating film.

Next, a conductive material is supplied to the space S2 and the space S3 through the groove G1. As a result, the word line WL is formed in the second space S2 and a part of the third space S3. The protruding portion 42 (the first protruding portion 42A or the second protruding portion 42B) is formed in another part of the third space S3 (refer to (h) in FIG. 9).

Figure 10:
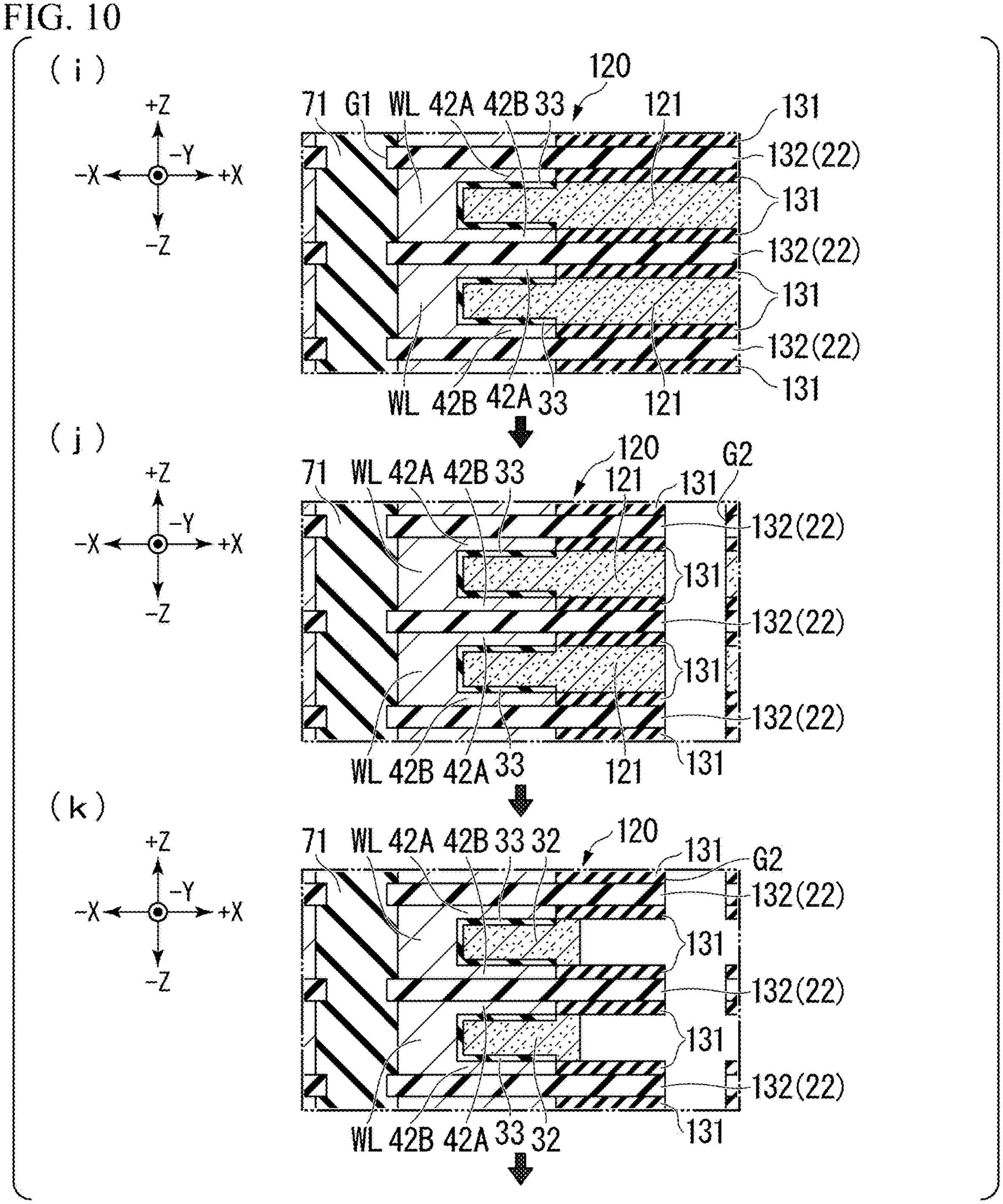
FIG. 10 is a cross-sectional view showing the first example of the method of manufacturing the semiconductor storage device according to the first embodiment.

Next, an insulating material is supplied to the groove G1, and the insulating portion 71 is formed in the groove G1 (refer to (i) in FIG. 10). Next, a groove G2 is formed in the multi-layered body 120. The groove G2 passes through the plurality of first layers 121, the plurality of first insulating layers 131, and the plurality of second insulating layers 132 in the Z direction and reaches the semiconductor substrate 10 (refer to (j) in FIG. 10). Next, a part of the first layer 121 is removed by etching through the groove G2 (refer to (k) in FIG. 10). As a result, the remaining portion of the first layer 121 becomes the semiconductor layer 32.

Figure 11:
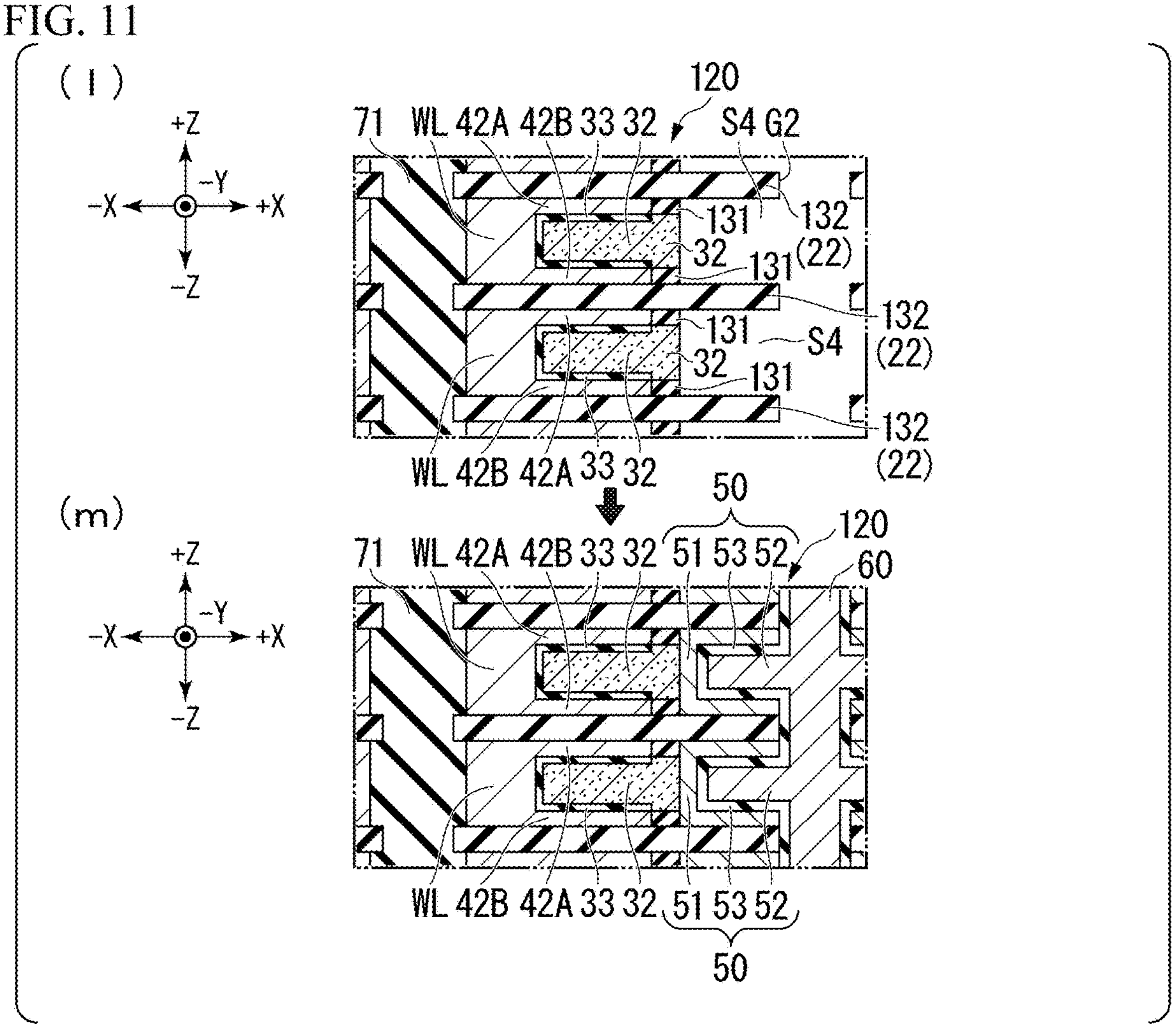
FIG. 11 is a cross-sectional view showing the first example of the method of manufacturing the semiconductor storage device according to the first embodiment.

Next, a part of the first insulating layer 131 is removed by etching through the groove G2 (refer to (1) in FIG. 11). As a result, a fourth space S4 is formed in the multi-layered body 120 in place of a part of the second insulating layer 132 and a part of the first insulating layer 131. Next, inside the fourth space S4, the first capacitor electrode 51, the capacitor dielectric layer 53, and the second capacitor electrode 52 are formed in that order. As a result, the capacitor 50 is formed inside the fourth space S4. In addition, in the step of forming the second capacitor electrode 52, the inside of the groove G2 is filled with a conductive material. As a result, the common electrode 60 is formed (refer to (m) in FIG. 10). Thereafter, the bit line BL, the body contact BC, the insulating portion 72, the insulating portion 73, and the like are provided, and the semiconductor storage device 1 is completed.

3.2 Second Example of Manufacturing Method

Next, a second example of a method of manufacturing the semiconductor storage device 1 will be described.

Figure 12:
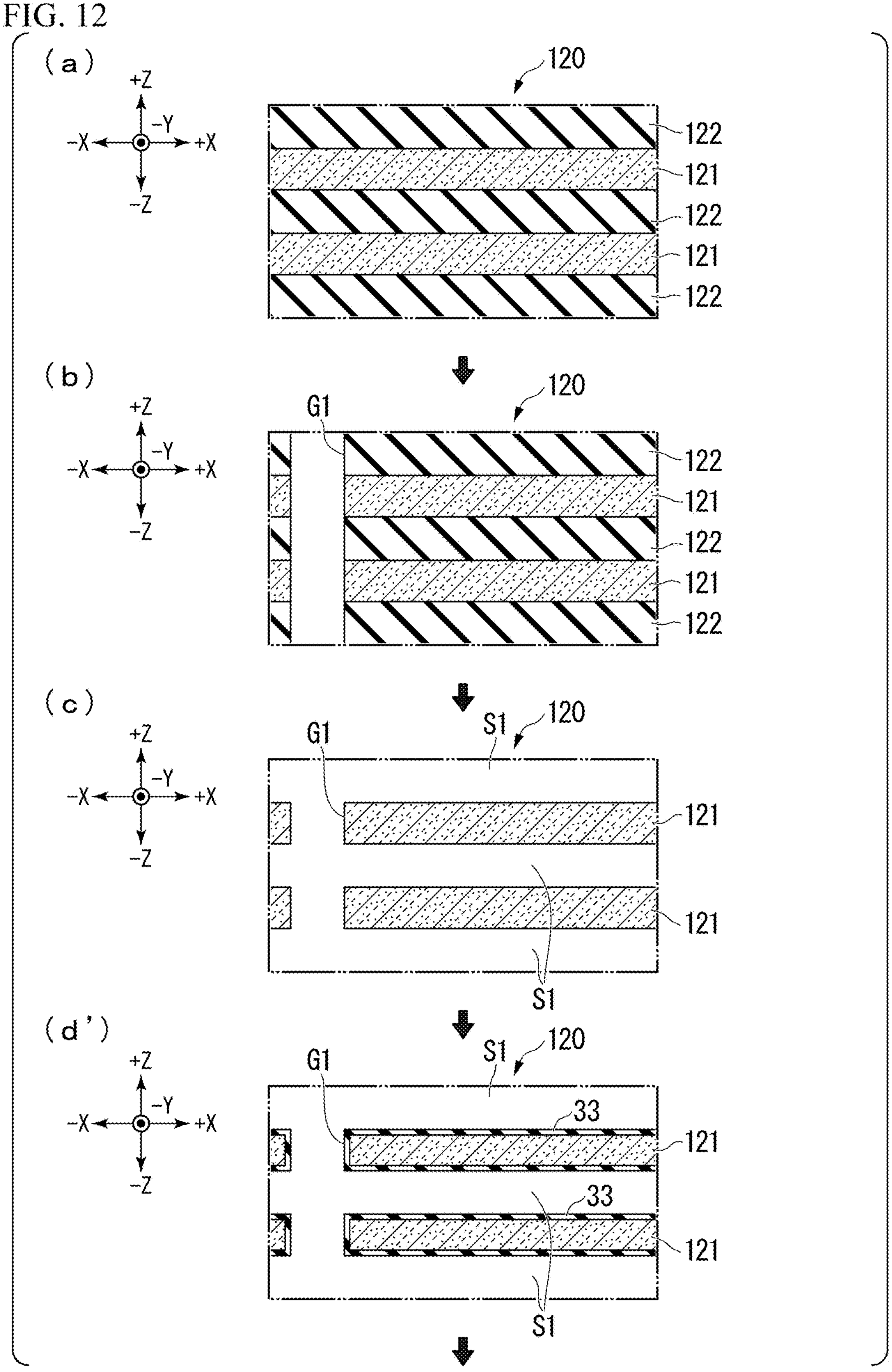
FIG. 12 is a cross-sectional view showing a second example of the method of manufacturing the semiconductor storage device according to the first embodiment.
Figure 13:
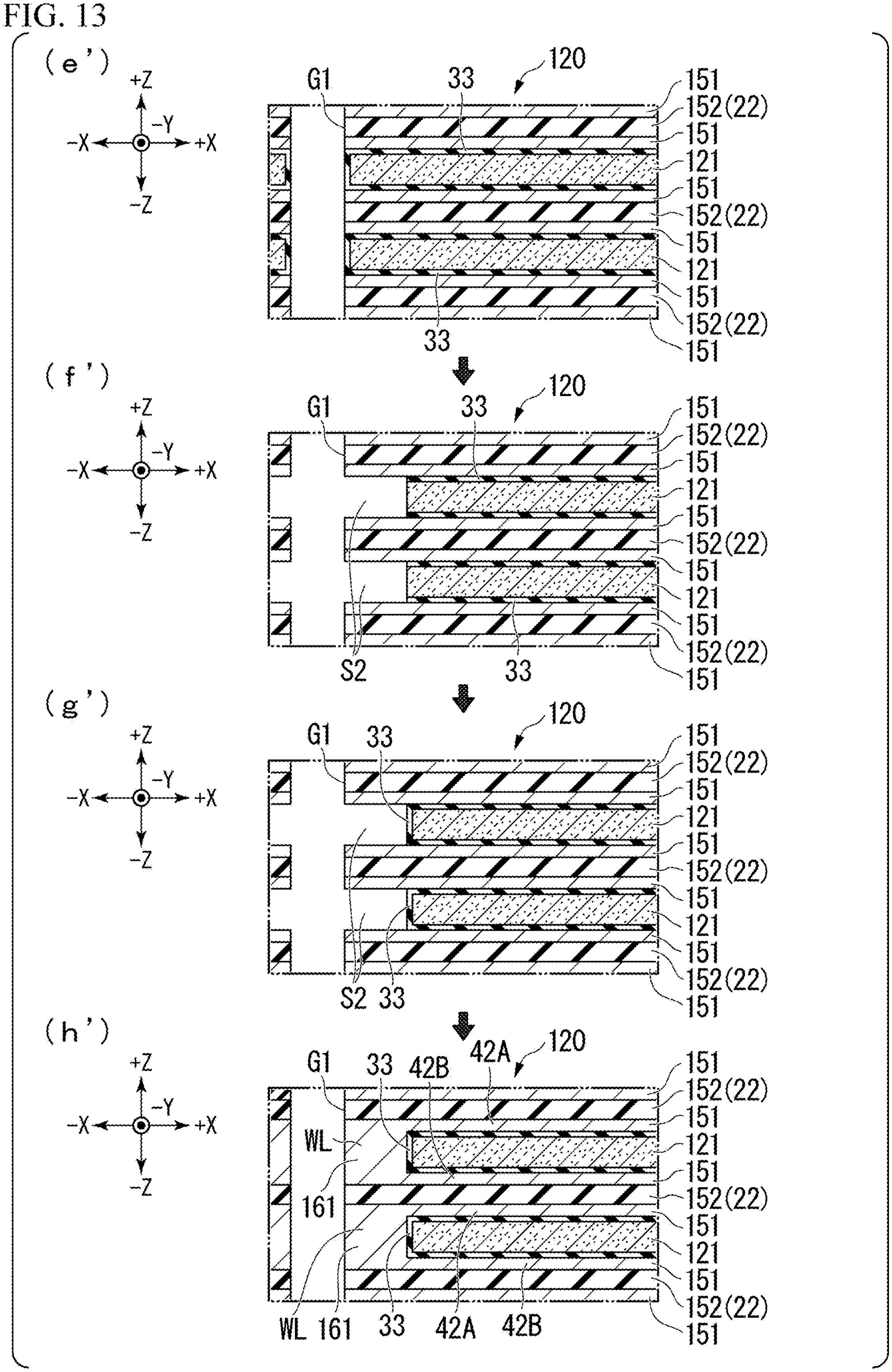
FIG. 13 is a cross-sectional view showing the second example of the method of manufacturing the semiconductor storage device according to the first embodiment.

FIGS. 12 and 13 are cross-sectional views showing the second example of the method of manufacturing the semiconductor storage device 1. The steps (a) to (c) in FIG. 12 are the same as those in the first example of the manufacturing method described with reference to (a) to (c) in FIG. 8. For this reason, a description of these steps will be omitted.

In the second example of the manufacturing method, an oxidizing agent is supplied to the first space S1 to oxidize the surface of the first layer 121 exposed in the first space S1. As a result, a part of the gate insulating film 33 is formed on the surface of the first layer 121 (refer to (d') in FIG. 12).

Next, a conductive material is supplied to the first space S1 through the groove G1, and a first conductive layer 151 is formed on the first layer 121. The first conductive layer 151 is formed of, for example, titanium nitride (TiN). Next, an insulating material is supplied between a plurality of first conductive layers 151 through the grooves G1, and an insulating layer 152 is formed between the plurality of first conductive layers 151 (refer to (e') in FIG. 13). The insulating layer 152 is formed of, for example, silicon oxide (SiO). The insulating layer 152 is an insulating layer that becomes the second layer 22.

Next, a part of the first layer 121 is removed by etching through the groove G1 (refer to (f') in FIG. 13). As a result, a second space S2 is formed in the multi-layered body 120 in place of a part of the first layer 121. Next, an oxidizing agent is supplied to the second space S2 to oxidize the surface of the first layer 121 exposed in the second space S2. As a result, the remaining portion of the gate insulating film 33 is formed on the oxidized surface of the first layer 121 (refer to (g') in FIG. 13). Next, a conductive material is supplied to the second space S2 through the groove G1. As a result, a second conductive layer 161 is formed in the second space S2 (refer to (h') in FIG. 13). In the present embodiment, the word line WL is formed by a part of the first conductive layer 151 and the second conductive layer 161. In addition, the protruding portion 42 (the first protruding portion 42A or the second protruding portion 42B) is formed by another part of the first conductive layer 151. The subsequent steps are similar to those in the first example of the manufacturing method described with reference to FIGS. 10 and 11.

4. Advantages

As a first comparative example, a structure in which word lines WL are disposed above and below a semiconductor layer 32 is considered. According to such a configuration of the first comparative example, a pitch in a stacking direction becomes large, making it difficult to reduce a cell size.

As a second comparative example, a structure in which a semiconductor layer 32 is disposed on a side of a word line WL (a structure in which a gate electrode is disposed only on a side surface of a channel) is considered. In such a configuration of the second comparative example, the semiconductor layer 32 that forms the channel is not covered with the gate electrode. For this reason, the semiconductor layer 32 may be easily affected by a potential of another word line WL adjacent in the +Z direction or in the −Z direction, and at least one of a decrease in on-current and an increase in off-leakage may occur.

On the other hand, in the present embodiment, the semiconductor storage device 1 has the multi-layered body 20 and the bit line BL. The multi-layered body 20 includes the plurality of first layers 21 and the plurality of second layers 22. The plurality of first layers 21 and the plurality of second layers 22 are alternately stacked one by one in the Z direction. The bit line BL extends in the multi-layered body 20 in the Z direction. Each of the plurality of first layers 21 includes the word line WL, the first capacitor electrode 51, the semiconductor layer 32, the first protruding portion 42A, and the second protruding portion 42B. The word line WL extends in the Y direction. The semiconductor layer 32 is disposed between the word line WL and the first capacitor electrode 51. The first protruding portion 42A protrudes from the word line WL in the X direction and covers at least a part of the semiconductor layer 32 from the side in the +Z direction. The second protruding portion 42B protrudes from the word line WL in the X direction and covers at least a part of the semiconductor layer 32 from the side in the −Z direction.

According to such a configuration, the word line WL and the semiconductor layer 32 are disposed in the same layer. For this reason, compared to the above first comparative example, the pitch in the stacking direction can be made smaller, and the cell size can be reduced. In addition, when the first protruding portion 42A and the second protruding portion 42B are provided, the semiconductor layer 32 is unlikely to be affected by a potential of another word line WL adjacent in the +Z direction or in the −Z direction compared to the second comparative example. For this reason, it is possible to suppress interference between the upper and lower cells and to achieve at least one of an increase in on-current and a decrease in off-leakage while maintaining the reduced cell size structure. As a result, it is possible to improve the electrical characteristics of the semiconductor storage device 1. In addition, according to the above configuration, the on-current increases as a gate width increases, and thus the semiconductor layer 32 can be made thinner.

In the present embodiment, the width W42$x$ of the first protruding portion 42A in the X direction is greater than, for example, the thickness T32$z$ of the semiconductor layer 32 in the Z direction. According to such a configuration, a relatively wide region of the semiconductor layer 32 can be covered by the first protruding portion 42A. As a result, it is possible to further improve the electrical characteristics of the semiconductor storage device 1.

In the present embodiment, the width W42$y$ of the first protruding portion 42A in the Y direction is greater than or equal to the width W32$y$ of the semiconductor layer 32 in the Y direction. According to such a configuration, a relatively wide region of the semiconductor layer 32 can be covered by the first protruding portion 42A. As a result, it is possible to further improve the electrical characteristics of the semiconductor storage device 1.

In the present embodiment, the bit line BL has a circular outer shape when viewed in the Z direction. The first protruding portion 42A has the edge 42$e$. The edge 42$e$ is spaced from the bit line BL. The edge 42$e$ includes a portion of an arcuate shape that follows the outer shape of the bit line BL when viewed in the Z direction. According to such a configuration, a relatively wide region of the semiconductor layer 32 can be covered by the first protruding portion 42A while avoiding interference with the bit line BL. As a result, it is possible to further improve the electrical characteristics of the semiconductor storage device 1.

In the present embodiment, the semiconductor storage device 1 has the body contact BC that extends in the Z direction within the multi-layered body 20. The semiconductor layer 32 extends in the Y direction. The bit line BL is adjacent to the semiconductor layer 32 at least in the X direction. The body contact BC is disposed at a position at which the body contact BC overlaps at least a part of the bit line BL when viewed in the Y direction. The body contact BC is adjacent to the semiconductor layer 32 at least in the X direction. According to such a configuration, the pitch of the memory cells arranged in the X direction can be made small.

5. Modification Example

Next, some modification examples will be described. In each of the modification examples, a configuration other than that which will be described below is the same as that of the first embodiment.

5.1 First Modification Example

Figure 14:
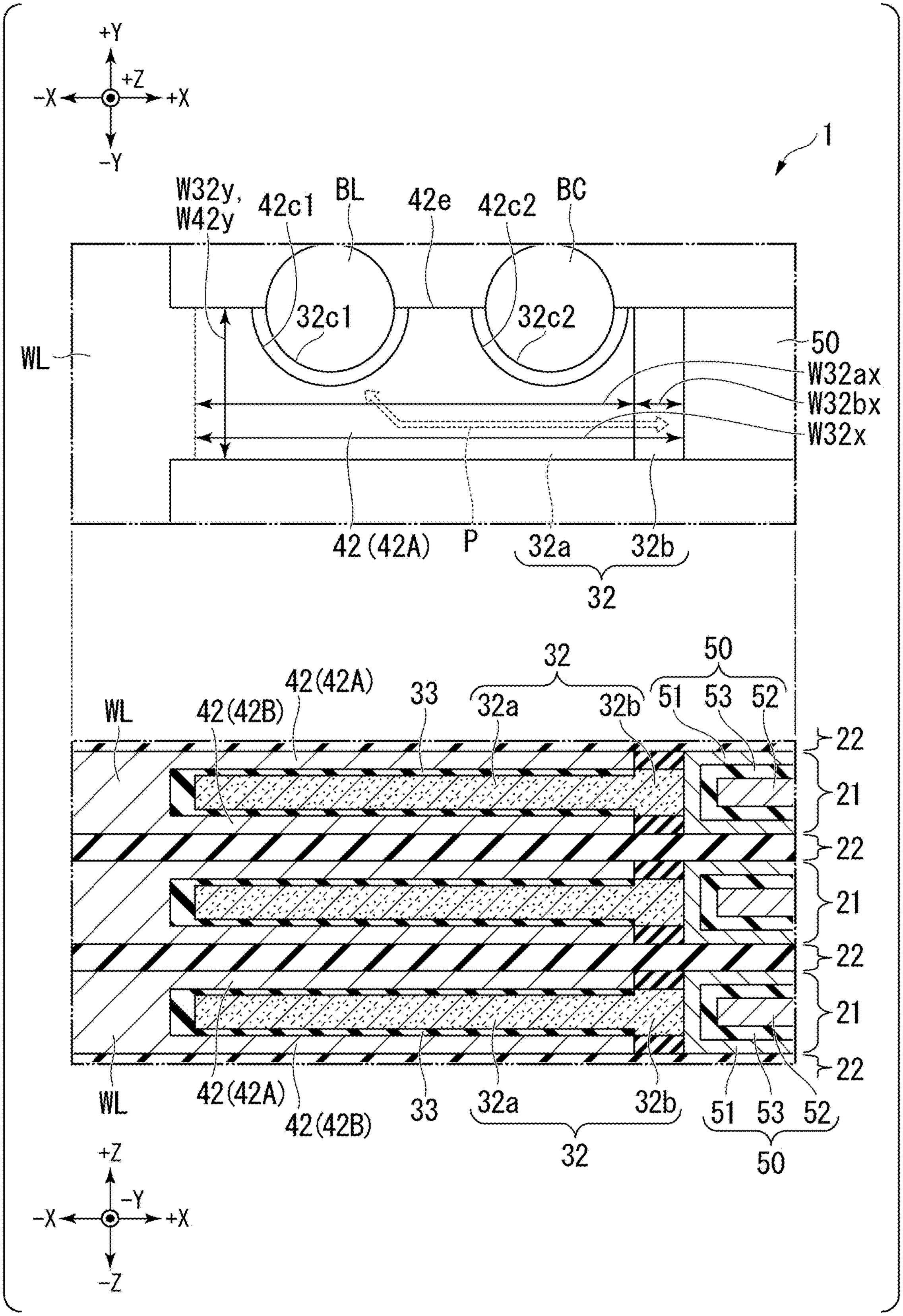
FIG. 14 is a perspective view showing a part of a semiconductor storage device according to a first modification example of the first embodiment.

FIG. 14 is a perspective view showing a part of a semiconductor storage device 1 according to a first modification example. In the first modification example, a semiconductor layer 32 extends in the X direction. A width W32$x$ of the semiconductor layer 32 in the X direction is larger than a width W32$y$ of the semiconductor layer 32 in the Y direction.

A bit line BL is located on the side in the +Y direction with respect to the semiconductor layer 32. The bit line BL is adjacent to the semiconductor layer 32 in the Y direction. The bit line BL is connected to the semiconductor layer 32. For example, at least a part of the bit line BL is in contact with the semiconductor layer 32 in the Y direction.

A body contact BC is located on the side in the +Y direction with respect to the semiconductor layer 32. The body contact BC is adjacent to the semiconductor layer 32 in the Y direction. The body contact BC is connected to the semiconductor layer 32. For example, at least a part of the body contact BC is in contact with the semiconductor layer 32 in the Y direction. The body contact BC is disposed at a position at which the body contact BC overlaps at least a part of the bit line BL when viewed in the X direction. The body contact BC is disposed between the bit line BL and the capacitor 50 in the X direction.

According to such a configuration, it is possible to improve the electrical characteristics of the semiconductor storage device 1 by providing a protruding portion 42.

5.2 Second Modification Example

Figure 15:
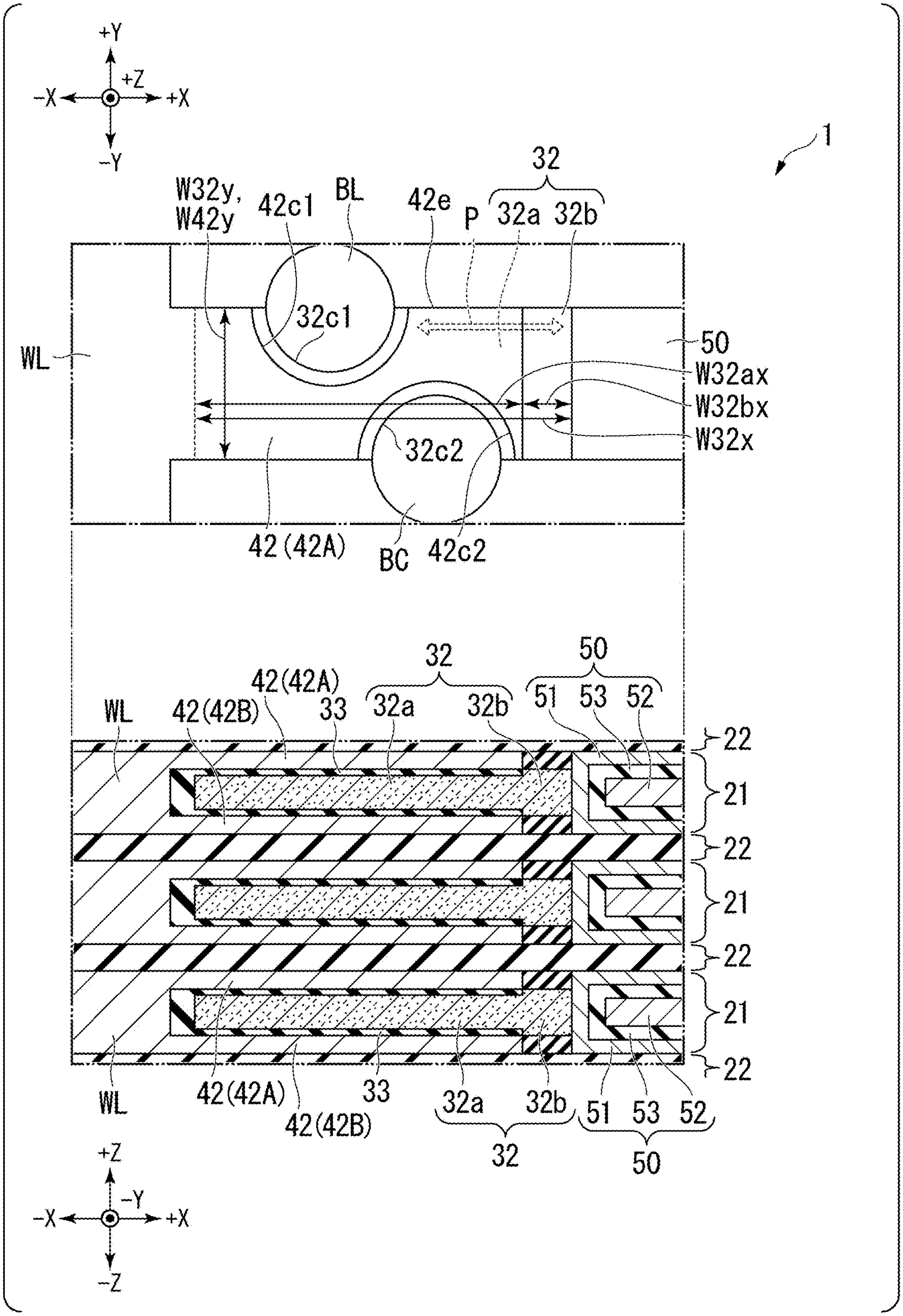
FIG. 15 is a perspective view showing a part of a semiconductor storage device according to a second modification example of the first embodiment.

FIG. 15 is a perspective view showing a part of a semiconductor storage device 1 according to a second modification example. In the second modification example, a semiconductor layer 32 extends in the X direction. A width W32$x$ of the semiconductor layer 32 in the X direction is larger than a width W32$y$ of the semiconductor layer 32 in the Y direction.

A bit line BL is located on the side in the +Y direction with respect to the semiconductor layer 32. The bit line BL is adjacent to the semiconductor layer 32 in the Y direction. The bit line BL is connected to the semiconductor layer 32. For example, at least a part of the bit line BL is in contact with the semiconductor layer 32 in the Y direction.

A body contact BC is located on the side in the −Y direction with respect to the semiconductor layer 32. The body contact BC is adjacent to the semiconductor layer 32 in the Y direction. The body contact BC is connected to the semiconductor layer 32. For example, at least a part of the body contact BC is in contact with the semiconductor layer 32 in the Y direction. The body contact BC is located on a side opposite to the bit line BL with respect to the semiconductor layer 32 in the Y direction. The body contact BC is disposed between the bit line BL and the capacitor 50 in the X direction.

According to such a configuration, it is possible to improve the electrical characteristics of the semiconductor storage device 1 by providing a protruding portion 42.

5.3 Third Modification Example

Figure 16:
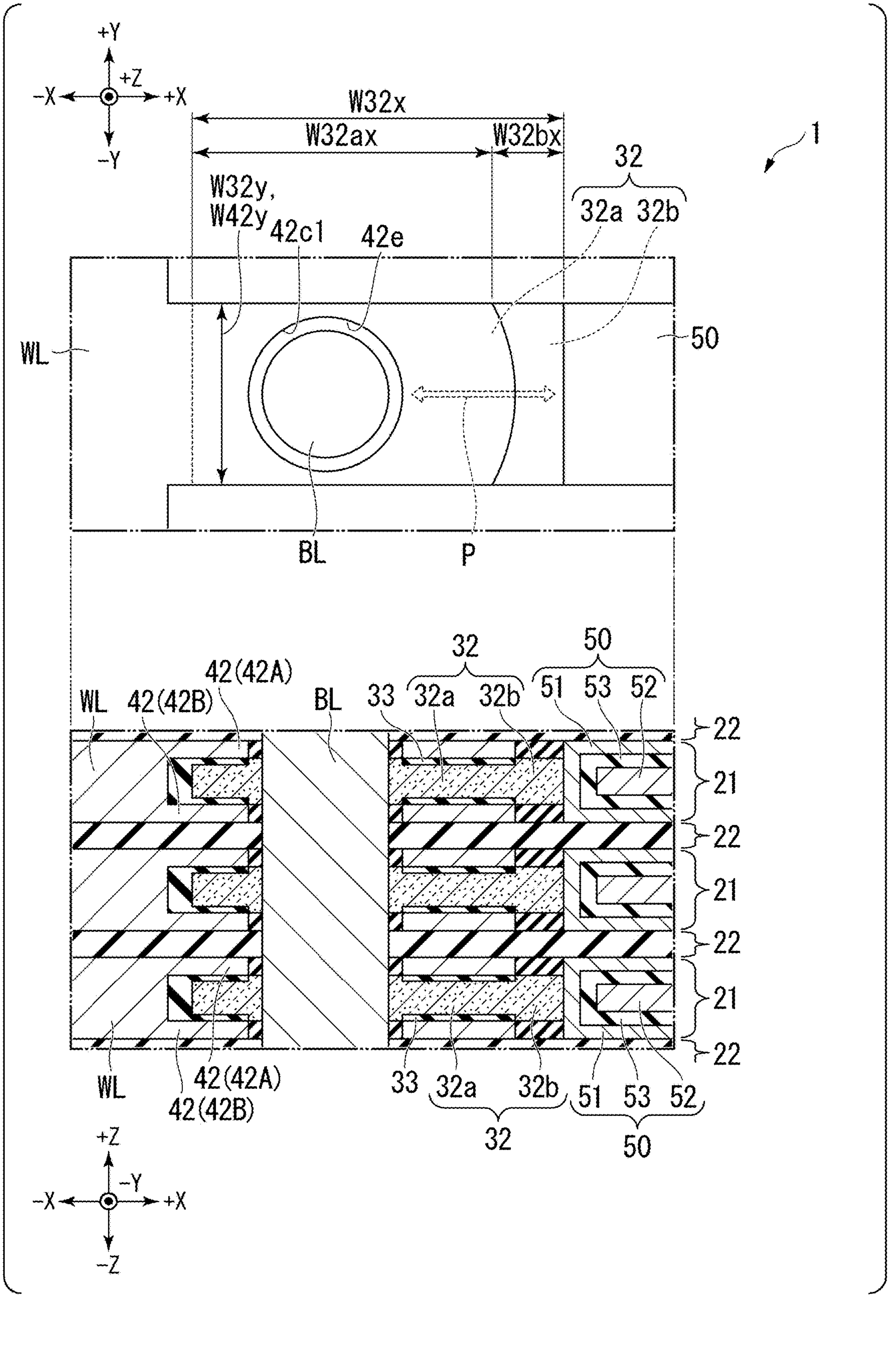
FIG. 16 is a perspective view showing a part of a semiconductor storage device according to a third modification example of the first embodiment.

FIG. 16 is a perspective view showing a part of a semiconductor storage device 1 according to a third modification example. In the third modification example, a semiconductor layer 32 extends in the X direction. A width W32$x$ of the semiconductor layer 32 in the X direction is larger than a width W32$y$ of the semiconductor layer 32 in the Y direction. The bit line BL is disposed corresponding to the center of the semiconductor layer 32 in the X direction when viewed in the Z direction. The bit line BL passes through the semiconductor layer 32 in the Z direction.

According to such a configuration, it is possible to improve the electrical characteristics of the semiconductor storage device 1 by providing a protruding portion 42.

Second Embodiment

Next, a second embodiment will be described. The second embodiment differs from the first embodiment in that a second layer 22 includes a capacitor electrode 202. A configuration other than that which will be described below is the same as that of the first embodiment.

Figure 17:
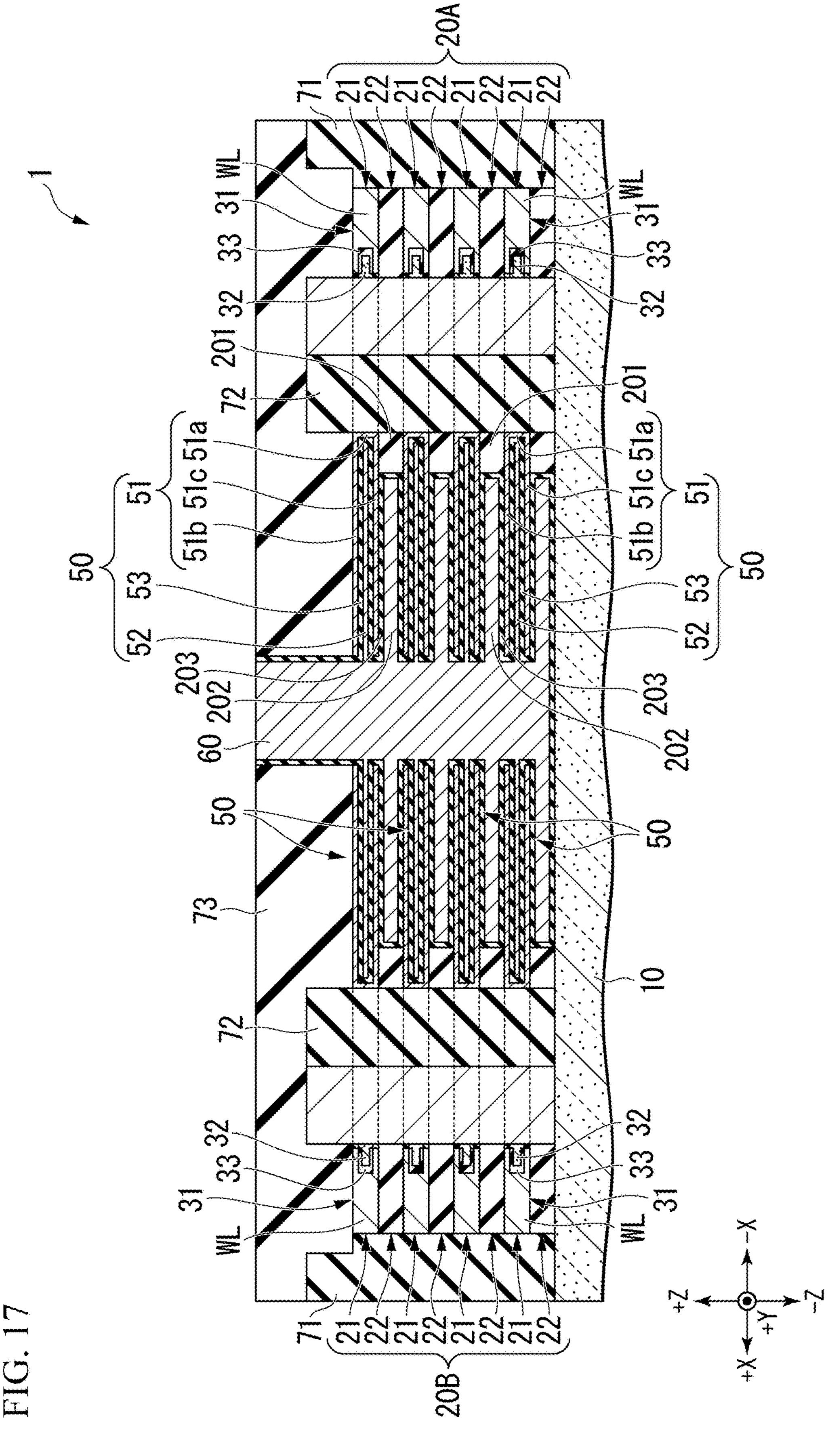
FIG. 17 is a cross-sectional view showing a part of a semiconductor storage device according to a second embodiment.

FIG. 17 is a view showing a part of a semiconductor storage device 1 according to the second embodiment. In the present embodiment, each of a plurality of second layers 22 includes, for example, an insulating layer 201, a capacitor electrode 202, and a capacitor dielectric layer 203.

The insulating layer 201 is provided in a portion of the second layer 22 which is different from the capacitor electrode 202 and the capacitor dielectric layer 203. For example, the insulating layer 201 is provided between the capacitor electrode 202 and an insulating portion 72. In addition, the insulating layer 201 is provided between the capacitor dielectric layer 203 and the insulating portion 72. The insulating layer 201 is formed of, for example, an insulating material such as silicon oxide (SiO).

The capacitor electrode 202 is connected to a common electrode 60 in the X direction. The capacitor electrode 202 is formed of, for example, a metal material such as tungsten. At least a part of the capacitor electrode 202 faces a first capacitor electrode 51 in the Z direction. In the present embodiment, the capacitor electrode 202 is a film extending in the X direction and the Y direction. The capacitor electrode 202 is disposed between a third portion 51$c$ and a second portion 51$b$. The third portion 51$c$ is a part of the first capacitor electrode 51 which is located on the side in the +Z direction. The second portion 51$b$ is a part of the first capacitor electrode 51 which is located on the side in the −Z direction. The capacitor electrode 202 faces, in the Z direction, the third portion 51$c$ of the first capacitor electrode 51 which is located on the side in the +Z direction. In addition, the capacitor electrode 202 faces, in the Z direction, the second portion 51$b$ of the first capacitor electrode 51 which is located on the side in the −Z direction.

The capacitor dielectric layer 203 is provided between the capacitor electrode 202 and the first capacitor electrode 51. In the present embodiment, the capacitor dielectric layer 203 is provided between the capacitor electrode 202 and the third portion 51$c$ of the first capacitor electrode 51 which is located on the side in the +Z direction. Furthermore, the capacitor dielectric layer 203 is provided between the capacitor electrode 202 and the second portion 51$b$ of the first capacitor electrode 51 which is located on the side in the −Z direction. The capacitor dielectric layer 203 is formed of a dielectric material such as hafnium oxide (HfOx). In the present embodiment, the capacitor electrode 202 and the capacitor dielectric layer 203 form a part of a capacitor 50. In the present embodiment, one charge storage portion is formed by the first capacitor electrode 51, the capacitor electrode 202, and the capacitor dielectric layer 203.

According to such a configuration, it is possible to improve the electrical characteristics of the semiconductor storage device 1 by providing a protruding portion 42. In a case in which the capacitor 50 has the capacitor electrode 202 and the capacitor dielectric layer 203, it does not need to have a second capacitor electrode 52 and a capacitor dielectric layer 53.

Third Embodiment

Next, a third embodiment will be described. The third embodiment differs from the first embodiment in that a bit line BL, a semiconductor layer 32, and a capacitor 50 are arranged in the Y direction. A configuration other than that which will be described below is the same as that of the first embodiment.

Figure 18:
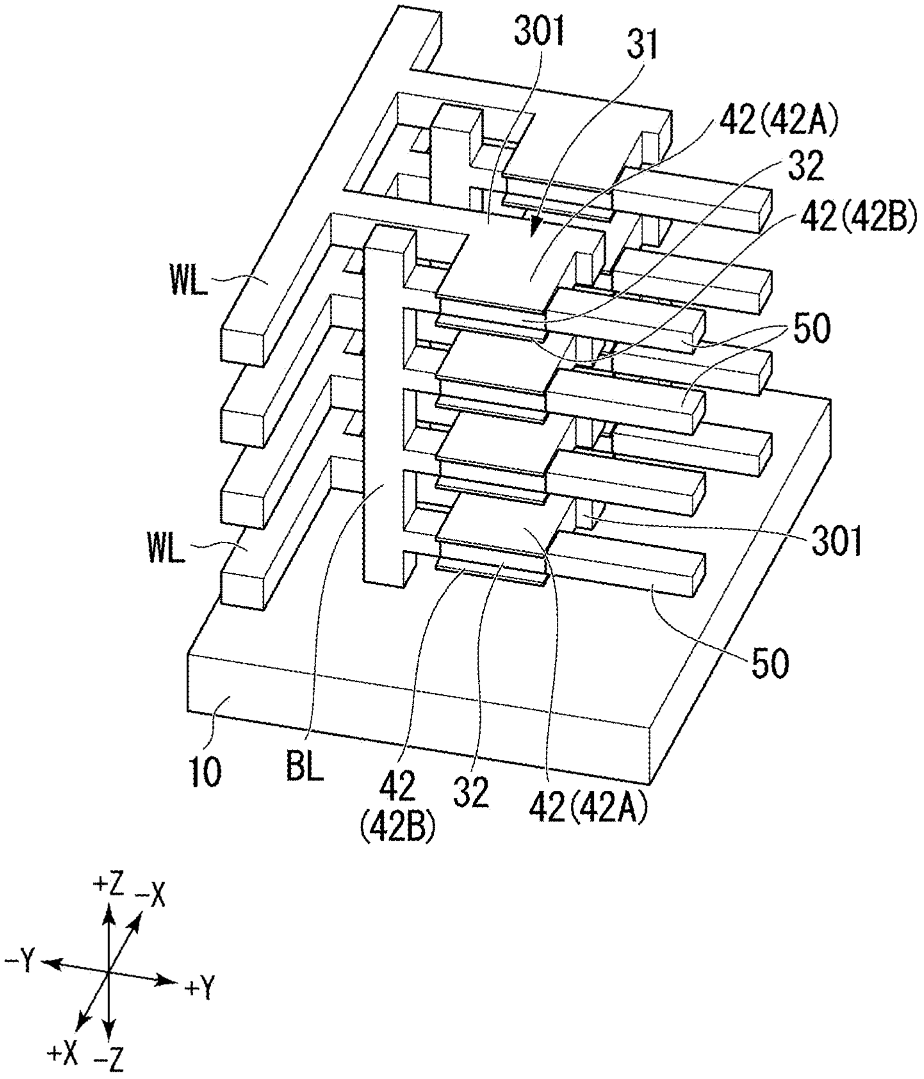
FIG. 18 is a cross-sectional view showing a part of a semiconductor storage device according to a third embodiment.

FIG. 18 is a view showing a part of a semiconductor storage device 1 according to the third embodiment. For ease of explanation, FIG. 18 omits the illustration of a second layer 22, extracts a configuration of a first layer 21, and shows the first layer 21 in an enlarged manner. In the present embodiment, the bit line BL extends in the Z direction. Each of a plurality of first layers 21 includes, for example, a conductive layer 31, the semiconductor layer 32, and the capacitor 50. A part of the bit line BL, the semiconductor layer 32, and the capacitor 50 are disposed side by side in the Y direction.

The conductive layer 31 includes, for example, a word line WL, a wiring 301, and a pair of protruding portions 42. The word line WL extends in the X direction. The wiring 301 branches off from the word line WL and extends in the Y direction. A part of the wiring 301 faces the semiconductor layer 32 in the X direction. The wiring 301 is an example of a "second wiring". The wiring 301 is a gate electrode facing the semiconductor layer 32 in the X direction. In the present application, the phrase "at least a part of the semiconductor layer is disposed between the second wiring and the capacitor" may include a case in which the second wiring (for example, the wiring 301) and the capacitor 50 are adjacent to the semiconductor layer 32 in different directions, as in the example shown in FIG. 18.

A first protruding portion 42A protrudes from the wiring 301 in the X direction. For example, the first protruding portion 42A protrudes in the X direction from a part of the wiring 301 which includes an end on the side in the +Z direction. The first protruding portion 42A covers at least a part of the semiconductor layer 32 from one side in the Z direction (the side in the +Z direction). The first protruding portion 42A is one gate electrode facing the semiconductor layer 32 in the Z direction.

A second protruding portion 42B protrudes from the wiring 301 in the X direction. For example, the second protruding portion 42B protrudes in the X direction from a part of the wiring 301 which includes an end on the side in the −Z direction. The second protruding portion 42B covers at least a part of the semiconductor layer 32 from the other side in the Z direction (the side in the −Z direction). The second protruding portion 42B is one gate electrode facing the semiconductor layer 32 in the Z direction.

According to such a configuration, it is possible to improve the electrical characteristics of the semiconductor storage device 1 by providing the protruding portion 42.

Although some embodiments and modification examples have been described above, the embodiments and the modifications are not limited to the above-described examples. For example, the above-described embodiments and modification examples may be implemented in combination with each other.

According to at least one of the embodiments described above, a semiconductor storage device includes a multi-layered body and a first wiring. The multi-layered body includes a plurality of first layers and a plurality of second layers. The plurality of first layers and the plurality of second layers are alternately stacked one by one in a first direction. The first wiring extends in the first direction within the multi-layered body. Each of the plurality of first layers includes a second wiring, a capacitor electrode, a semiconductor layer, a first gate electrode, and a second gate electrode. The second wiring extends in a second direction intersecting with the first direction. The semiconductor layer is provided between the second wiring and the capacitor electrode in a third direction intersecting with the first direction and the second direction. The first gate electrode is connected to the second wiring in the third direction and covers at least a part of the semiconductor layer from one side in the first direction. The second gate electrode is connected to the second wiring in the third direction and covers at least a part of the semiconductor layer from the other side in the first direction. According to such a configuration, it is possible to improve the electrical characteristics of the semiconductor storage device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:

a multi-layered body including a plurality of first layers and a plurality of second layers, the plurality of first layers and the plurality of second layers being alternately stacked one by one in a first direction; and a first wiring extending in the first direction within the multi-layered body, wherein each of the plurality of first layers includes second wiring extending in a second direction intersecting with the first direction, a capacitor electrode, a semiconductor layer, at least a part of the semiconductor layer being between the second wiring and the capacitor electrode, a first protruding portion protruding from the second wiring in a third direction intersecting with the first direction and the second direction, the first protruding portion covering at least a part of the semiconductor layer from one side in the first direction, and a second protruding portion protruding from the second wiring in the third direction, the second protruding portion covering at least a part of the semiconductor layer from the other side in the first direction.

2. The semiconductor storage device according to claim 1, wherein at least a part of the semiconductor layer is between the second wiring and the capacitor electrode in the third direction.

3. The semiconductor storage device according to claim 1, wherein a width of the first protruding portion in the third direction is greater than a thickness of the semiconductor layer in the first direction.

4. The semiconductor storage device according to claim 1, wherein a width of the first protruding portion in the second direction is greater than or equal to a width of the semiconductor layer in the second direction.

5. The semiconductor storage device according to claim 1, wherein a width of the semiconductor layer in the second direction is greater than a width of the semiconductor layer in the third direction.

6. The semiconductor storage device according to claim 1, wherein when viewed in the first direction, the first wiring has a circular outer shape, the first protruding portion has an edge, the edge is spaced from the first wiring, the edge includes a portion of an arcuate shape, and the arcuate shape follows the outer shape of the first wiring.

7. The semiconductor storage device according to claim 1, further comprising a contact extending in the first direction within the multi-layered body, wherein the first wiring is adjacent to the semiconductor layer at least in the third direction, the contact is at a position at which the contact overlaps at least a part of the first wiring when viewed in the second direction, and the contact is adjacent to the semiconductor layer at least in the third direction.

8. The semiconductor storage device according to claim 1, further comprising a contact extending in the first direction within the multi-layered body, wherein the first wiring is adjacent to the semiconductor layer at least in the second direction, and the contact is adjacent to the semiconductor layer at least in the second direction.

9. A method of manufacturing a semiconductor storage device, comprising:

alternately stacking a first layer and a second layer in a first direction to form a multi-layered body, the first layer and the second layer including silicon;

forming a groove extending in the first direction within the multi-layered body;

performing etching through the groove to remove at least a part of the second layer to form a first space within the multi-layered body;

forming a first insulating layer on the first layer within the first space;

forming a second insulating layer on the first insulating layer within the first space;

performing etching through the groove to remove a part of the first layer to form a second space within the multi-layered body, the second space extending in a second direction intersecting with the first direction;

performing etching through the groove to remove a part of the first insulating layer to form a third space within the multi-layered body, the third space protruding in a third direction away from the groove with respect to the second space; and supplying a conductive material to the second space and the third space to form a wiring and to form a protruding portion, the protruding portion protruding from the wiring in the third direction, the protruding portion covering at least a part of the first layer in the first direction.

10. A method of manufacturing a semiconductor storage device, comprising:

alternately stacking a first layer and a second layer in a first direction to form a multi-layered body, the first layer and the second layer including silicon;

forming a groove extending in the first direction within the multi-layered body;

performing etching through the groove to remove at least a part of the second layer to form a first space within the multi-layered body;

forming a gate insulating film on a surface of the first layer;

forming a first conductive layer on the gate insulating film within the first space;

forming an insulating layer on the first conductive layer within the first space;

performing etching through the groove to remove a part of the first layer to form a second space within the multi-layered body, the second space extending in a second direction intersecting with the first direction; and supplying a conductive material to the second space to form a second conductive layer within the second space, to form a wiring by a part of the first conductive layer and the second conductive layer, and to form a protruding portion by another part of the first conductive layer, the protruding portion protruding from the wiring in a third direction away from the groove, the protruding portion covering at least a part of the first layer in the first direction.

* * * * *